US009099176B1

(12) United States Patent
Buskirk

(10) Patent No.: US 9,099,176 B1
(45) Date of Patent: Aug. 4, 2015

(54) RESISTIVE SWITCHING MEMORY DEVICE WITH DIODE SELECT

(71) Applicant: Adesto Technologies Corporation, Sunnyvale, CA (US)

(72) Inventor: Michael Van Buskirk, Saratoga, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 0 days.

(21) Appl. No.: 14/256,123

(22) Filed: Apr. 18, 2014

(51) Int. Cl.
*G11C 11/00* (2006.01)
*G11C 13/00* (2006.01)

(52) U.S. Cl.
CPC .................................. *G11C 13/0002* (2013.01)

(58) Field of Classification Search
USPC .......................... 365/148, 100, 115, 175, 243
See application file for complete search history.

(56) References Cited

U.S. PATENT DOCUMENTS

| 6,834,008 | B2 | 12/2004 | Rinerson et al. | |
|---|---|---|---|---|
| 7,826,248 | B2 * | 11/2010 | Xi et al. | 365/148 |
| 7,885,121 | B2 * | 2/2011 | Takase | 365/185.23 |
| 8,730,752 | B1 | 5/2014 | Kamalanathan et al. | |
| 8,787,065 | B2 * | 7/2014 | Torsi | 365/148 |
| 8,861,258 | B2 * | 10/2014 | Lan et al. | 365/148 |
| 8,995,166 | B2 * | 3/2015 | Pramanik et al. | 365/148 |

OTHER PUBLICATIONS

Yoshio Nishi, Recent Progress in Resistive Switching Memories, Innovative Memory Workshop, Jun. 29, 2011, Grenoble, France URL: http://leti.congres-scientifique.com/workshopmemories/documents/4-STANFORD-UNIVERSITY-Nishi.pdf.
Seong Geon Park, Vertical ReRAM Technology for High Density Non-Volatile Memory, 5th Workshop on Innovative Memory Technologies, Jun. 27, 2013, Grenoble, France URL: http://www.leti-innovationdays.com/presentations/MemoryWorkshop/13_SGPark—VerticalReRAMTechnologyForHighDensityNonVolatileMemory.pdf.
H.-S. Philip Wong, Emerging Memories, Apr. 4, 2008 URL: http://asia.stanford.edu/events/spring08/slides402S/0403-Wong.pdf.
Yi-Chung Chen, et al., 3D-HIM: A 3D High-density Interleaved Memory for Bipolar RRAM Design, IEEE/ACM. Proceedings International Symposium on Nanoscale Architecture (NANOARCH), San Diego, CA, Jun. 8-9, 2011 URL: http://www.computer.org/csdl/proceedings/nanoarch/2011/0993/00/05941484-abs.html.

(Continued)

*Primary Examiner* — Pho M Luu
(74) *Attorney, Agent, or Firm* — Michael C. Stephens, Jr.

(57) ABSTRACT

A resistive switching memory device can include a plurality of resistive memory cells, where each of the resistive memory cells includes: (i) a first diode having an anode coupled to a first word line and a cathode coupled to a common node; (ii) a second diode having an anode coupled to the common node and a cathode coupled to a second word line; and (iii) a resistive storage element having an anode coupled to a bit line and a cathode coupled to the common node, wherein the resistive memory cell is configured to be programmed to a low resistance state by application of a program voltage in a forward bias direction, and to be erased to a high resistance state by application of an erase voltage in a reverse bias direction.

20 Claims, 20 Drawing Sheets

(56) References Cited

OTHER PUBLICATIONS

Derchang Kau, et al., A Stackable Cross Point Phase Change Memory, Electron Devices Meeting (IEDM), 2009 IEEE International, Dec. 7-9, 2009 URL: http://www.stanford.edu/~jakalb/cv/articles/SantaClara-Kau-2009-IEDM.pdf.
Pi-Feng Chiu, et al., Differential 2R Crosspoint RRAM for Memory System in Mobile Electronics with Zero Standby Current, EE241 Final Project Report, Spring 2013 URL: http://www.eecs.berkeley.edu/~pfchiu/EE24_finalReport.pdf.
An Chen, et al., ITRS Public Conference, Emerging Research Devices, ITRS Winter Conference, Hsinchu, Taiwan, Dec. 5, 2012 URL: http://public.itrs.net/Links/2012Winter/1205%20Presentation/ERD_12052012.pdf.
Greg Atwood, Current and Emerging Memory Technology Landscape, Flash Memory Summit 2011, Santa Clara, CA, Aug. 9-11, 2011 URL: http://www.micron.com/~/media/Documents/Products/Presentation/gatwood_current_emerging_memory_landscape_fms2011_FINAL.pdf.
Elaine Ou, Array Architecture for a Nonvolatile 3-Dimensional Cross-Point Memory, Stanford University dissertation submitted Mar. 2010 URL: http://searchworks.stanford.edu/view/8572524.
MIEC Access Device for 3-D-Crosspoint Nonvolatile Memory Arrays, IBM Almaden Research Center, San Jose, CA, Jan. 3, 2013 URL: http://researcher.watson.ibm.com/researcher/files/us-gwburr/MIECOverviewPublicDomain_Jan2013_3.pdf.
Tong Xiaodong, Design of two-terminal PNPN diode for high-density and high-speed memory applications, Journal of Semiconductors, vol. 35, No. 1, Jan. 2014 URL: http://www.researchgate.net/publication/260295264_Design_of_two-terminal_PNPN_diode_for_high-density_and_high-speed_memory_applications.
I. G. Baek, et al., "Highly scalable nonvolatile resistive memory using simple binary oxide driven by asymmetric unipolar voltage pulses," in IEDM Tech. Dig, 2007, 2004, pp. 587-590.
K. Tsunoda, et al., "Low Power and High Speed Switching of Ti-doped NiO ReRAM under the Unipolar Voltage Source of less than 3 V," in IEDM Tech. Dig, 2007, pp. 767-770.
B. Govoreanu, et al.,"Vacancy-Modulated Conductive Oxide Resistive RAM(VMCO-RRAM):An Area-Scalable Switching Current,Self-Compliant,Highly Nonlinear and Wide On/Off-Window Resistive Switching Cell," in IEDM Tech. Dig. 2013, pp. 10.2.1-10.2.4.
R. Meyer, et al., "Oxide dual-layer memory element for scalable non-volatile cross-point memory technology," in NVMTS, 2008, pp. 1-5.
C. J. Chevallier, et al., "A 0.13um 64Mb multi-layered conductive metal-oxide memory," in IEEE ISSCC Tech Dig., 2010, pp. 260-261.
W. C. Shen, et al., "High-K metal gate contact RRAM (CRRAM) in pure 28nm CMOS logic process," in IEDM Tech. Dig., 2012, pp. 31.6.1-31.6.4.
Gilbert, Nad, et al., "A 0.6 V 8 pJ/write Non-Volatile CBRAM Macro Embedded in a Body Sensor Node for Ultra Low Energy Applications." in IEEE VLSIC, 2013, pp. C204-C205.
T. Sakamoto, et al., "A nonvolatile programmable solid electrolyte nanometer switch," in ISSCC Tech. Digest, 2004, pp. 290-529 vol. 1. Note: 1 kb Cu2S/Cu cell array in 0.18 μm CMOS.
M. Kund, et al., "Conductive bridging RAM (CBRAM): an emerging non-volatile memory technology scalable to sub 20nm," in IEDM Tech. Digest, 2005, pp. 754-757.
J.R. Jameson, et al.,"Quantized Conductance in Ag/GeS2/W Conductive-Bridge Memory Cells," IEEE Electron Dev. Lett., vol. 33, pp. 257-259, Feb. 2012.
L. Goux, et al., "Field-driven ultrafast sub-ns programming in W/Al2O3/Ti/CuTe-based 1T1R CBRAM system," in VLSI Technology Tech Dig., 2012, pp. 69-70.
C.-L. Tsai, et al., "Resistive Random Access Memory Enabled by Carbon Nanotube Crossbar Electrodes," ACS Nano, vol. 7, pp. 5360-5366, Jun. 2013.
S.-G. Park, et al., "A non-linear ReRAM cell with sub-1uA ultralow operating current for high density vertical resistive memory (VRRAM)," in IEDM Tech. Dig., 2012, pp. 20.8.1-20.8.4.
A. C. Torrezan, et al., "Sub-nanosecond switching of a tantalum oxide memristor," Nanotechnology, vol. 22, p. 485203, 2011.
Z. Wei, et al., "Highly reliable TaOx ReRAM and direct evidence of redox reaction mechanism," in IEDM Tech. Dig., 2008.
K. Young-Bae, et al., "Bi-layered RRAM with unlimited endurance and extremely uniform switching," in VLSI Technology (VLSIT), 2011 Symposium on, 2011, pp. 52-53.
J. P. Strachan, et al., "Measuring the switching dynamics and energy efficiency of tantalum oxide memristors," Nanotechnology, vol. 22, p. 505402, 2011.
M.-J. Lee, et al. "A fast, high-endurance and scalable non-volatile memory device made from asymmetric Ta2O5-x/TaO2-x bilayer structures," Nat Mater, vol. 10, pp. 625-630, Aug. 2011.
M. N. Kozicki, et al., "Nanoscale memory elements based on solid-state electrolytes," IEEE Trans. Nanotechnology, vol. 4, pp. 331-338, May 2005.
Otsuka, Wataru, et al., "A 4mb conductive-bridge resistive memory with 2.3 gb/s read-throughput and 216mb/s program-throughput." ISSCC Tech Dig., 2011, pp. 210-211.
J. Jameson, "Conductive-Bridge memory (CBRAM) with excellent high temperature retention." IEDM Tech. Dig., 2013, pp. 30.1.1-30.1.4.
C. Kügeler, et al., "Materials, technologies, and circuit concepts for nanocrossbar-based bipolar RRAM", Appl. Phys. A (2011) 791-809.
J.H. Oh, et al. "Full integration of highly manufacturable 512Mb PRAM based on 90nm technology," IEDM Tech. Dig., pp. 515-518, Dec. 2006.
Y. Sasago, et al., "Cross-point phase change memory with 4F2 cell size driven by low-contact resistivity poly-Si diode", 2009 VLSI Symp., 24-25.
N. Huby, et al. "New selector based on zinc oxide grown by low temperature atomic layer deposition for vertically stacked non-volatile memory devices," Microelectronic Eng., vol. 85, No. 12, pp. 2442-2444, Dec. 2008.
B. Cho, et al "Rewritable Switching of One Diode-One Resistor Nonvolatile Organic Memory Devices," Adv. Mater., vol. 22, No. 11, pp. 1228-1232, Mar. 2010.
W.Y. Park, et al., "A Pt/TiO2/Ti Schottky-type selection diode for alleviating the sneak current in resistance switching memory arrays," Nanotechnology, vol. 21, No. 19, pp. 195201-1-195201-4, May 2010.
Y.C. Shin, et al."(In,Sn)2O3/TiO2/Pt Schottky-type diode switch for the TiO2 resistive switching memory array," Appl. Phys. Lett., vol. 92, No. 16, pp. 162904-1-162904-3, Apr. 2008.
G.H. Kim, et al., "Schottky diode with excellent performance for large integration density of crossbar resistive memory," Appl. Phys. Lett., vol. 100, No. 21, pp. 213508-1-213508-3, May 2012.
J.J. Huang, et al., "Transition of stable rectification to resistive-switching in Ti/TiO2/Pt oxide diode," Appl. Phys. Lett., vol. 96, No. 26, pp. 262901-1-262901-3, Jun. 2010.
Y. Choi, et al. "High current fast switching n—ZnO/p—Si diode," J. Phys. D: Appl. Phys., vol. 43, pp. 345101-1-345101-4, Aug. 2010.
S.E. Ahn, et al., "Stackable all-oxide-based nonvolatile memory with Al2O3 antifuse and p—CuOx/n—InZnOx diode," IEEE Electron Dev. Lett., vol. 30, No. 5, pp. 550-552, May 2009.
M.J. Lee, et al., "A low-temperature-grown oxide diode as a new switch element for high-density, nonvolatile memories," Adv. Mater., vol. 19, No. 1, pp. 73-76, Jan. 2007.
M.J. Lee, et al.,"2-stack 1D-1R cross-point structure with oxide diodes as switch elements for high density resistance RAM applications," IEDM Tech. Dig., pp. 771-774, Dec. 2007.
M.J. Lee, et al.,"Stack friendly all-oxide 3D RRAM using GaInZnO peripheral TFT realized over glass substrates," IEDM Tech. Dig., Dec. 2008.
S. Narushima, et al., "A p-type amorphous oxide semiconductor and room temperature fabrication of amorphous oxide p—n heterojunction diodes," Adv. Mater., vol. 15, No. 17, pp. 1409-1413, Sep. 2003.

(56) References Cited

OTHER PUBLICATIONS

S. Kim, et al., "Ultrathin (<10nm) Nb2O5/NbO2 hybrid memory with both memory and selector characteristics for high density 3D vertically stackable RRAM applications," Symposium VLSI Tech., pp. 155-156, Jun. 2012.

J.H. Lee, et al. "Threshold switching in Si—As—Te thin film for the selector device of crossbar resistive memory," Appl. Phys. Lett., vol. 100, No. 12, pp. 123505-1-123505-4, Mar. 2012.

M.J. Lee, et al., "Highly-Scalable Threshold Switching Select Device based on Chaclogenide Glasses for 3D Nanoscaled Memory Arrays," IEDM Tech. Dig., pp. 33-35, Dec. 2012.

M.-J. Lee, et al. "A simple device unit consisting of all NiO storage and switch elements for multilevel terabit nonvolatile random access memory", ACS Appl. Mater. Interfaces, vol. 3, No. 11, pp. 4475-4479, Oct. 2011.

M.-J. Lee, et al., "Two series oxide resistors applicable to high speed and high density nonvolatile memory", Advanced Materials, vol. 19, No. 22, pp. 3919-3923, Nov. 2007.

M. Son, et al., "Excellent selector characteristics of nanoscale VO2 for high-density bipolar ReRAM applications", IEEE Electron Dev. Lett., vol. 32, No. 11, pp. 1579-1581, Nov. 2011.

J.J. Huang, et al., "Bipolar nonlinear Ni/TiO2/Ni selector for 1S1R crossbar array applications," IEEE Electron Dev. Lett., vol. 32, No. 10, pp. 1427-1429, Oct. 2011.

J. Shin, et al., "TiO2-based metal-insulator-metal selection device for bipolar resistive random access memory cross-point application," J. Appl. Phys., vol. 109, No. 3, pp. 033712-1-033712-4, Feb. 2011.

W. Lee, et al., "Varistor-type bidirectional switch (JMAX>107A/cm2, selectivity~104) for 3D bipolar resistive memory arrays," Symposium VLSI Tech., pp. 37-38, Jun. 2012.

B. Govoreanu, et al., "High-performance metal-insulator-metal tunnel diode selectors", IEEE Electron Dev. Lett., vol. 35, No. 1, pp. 63-65, Jan. 2014.

S. Kim, et al., "Integrating phase-change memory cell with Ge nanowire diode for crosspoint memory—experimental demonstration and analysis," IEEE Trans. Electron Dev., vol. 55, No. 9, pp. 2307-2313, Sep. 2008.

L. Zhang, et al., "Ultrathin Metal/Amorphous-Silicon/Metal Diode for Bipolar RRAM Selector Applications", Feb. 2014.

K. Virwani, et al., "Sub-30nm scaling and high-speed operation of fully-confined access-devices for 3D crosspoint memory based on mixed-ionic-electronic-conduction (MIEC) materials," IEDM Tech. Dig., pp. 36-39, Dec. 2012.

Q. Zuo, et al., "Self-rectifying effect in gold nanocrystal-embedded zirconium oxide resistive memory," J. Appl. Phys., vol. 106, No. 7, pp. 073724-1-073724-5, Oct. 2009.

M. Jo, et al., "Novel Cross-point Resistive Switching Memory with Self-formed Schottky Barrier," Symposium VLSI Tech., pp. 53-54, Jun. 2010.

X.A. Tran, et al., "Self-selection unipolar HfOx-Based RRAM," IEEE Trans. Dev., vol. 60, No. 1, pp. 391-395 Jan. 2013.

X.A. Tran, et al., "A self-rectifying AlOy bipolar RRAM with sub-50-μA set/reset current for cross-bar architecture," IEEE Electron Dev. Lett., vol. 33, No. 10, pp. 1402-1404, Oct. 2012.

H. Lv, et al., "Self-rectifying resistive-switching device with a-Si/WO3 bilayer," vol. 34, No. 2, pp. 229-231, Feb. 2013.

K.H. Kim, et al., "Nanoscale resistive memory with intrinsic diode characteristics and long endurance," Appl. Phys. Lett., vol. 96, pp. 053106-1-053106-3, Feb. 2010.

\* cited by examiner

RESISTIVE SWITCHING MEMORY DEVICE WITH DIODE SELECT

FIELD OF THE INVENTION

The present invention generally relates to the field of semiconductor memory. More specifically, embodiments of the present invention pertain to resistive random-access memory (ReRAM) and/or conductive bridging RAM (CBRAM) processes and devices.

BACKGROUND

Non-volatile memory (NVM) is increasingly found in applications, such as solid-state hard drives, removable digital picture cards, and so on. Flash memory is the predominant NVM technology in use today. However, flash memory has limitations, such as a relatively high power, as well as relatively slow operation speed. Other NVM technologies, such as resistive switching memory technologies that include resistive RAM (ReRAM) and conductive bridging RAM (CBRAM), may offer relatively lower power and higher speeds as compared to flash memory technologies. For example, CBRAM utilizes a conductive bridging cell technology, which has the potential to scale to smaller sizes than flash memory devices.

SUMMARY

Embodiments of the present invention relate to a resistive switching memory device with diode selection. Particular embodiments are suitable for resistive switching memories, such as resistive random-access memory (ReRAM) and/or conductive bridging RAM (CBRAM) memory cells.

In one embodiment, a resistive switching memory device can include a plurality of resistive memory cells, where each of the resistive memory cells includes: (i) a first diode having an anode coupled to a first word line and a cathode coupled to a common node; (ii) a second diode having an anode coupled to the common node and a cathode coupled to a second word line; and (iii) a resistive storage element having an anode coupled to a bit line and a cathode coupled to the common node, wherein the resistive memory cell is configured to be programmed to a low resistance state by application of a program voltage in a forward bias direction, and to be erased to a high resistance state by application of an erase voltage in a reverse bias direction.

In one embodiment, a resistive switching memory device can include a plurality of resistive memory cells, where each of the resistive memory cells includes: (i) a first diode having an anode coupled to a first word line and a cathode coupled to a common node; (ii) a second diode having an anode coupled to the common node and a cathode coupled to a second word line; and (iii) a resistive storage element having a cathode coupled to a bit line and an anode coupled to the common node, wherein the resistive memory cell is configured to be programmed to a low resistance state by application of a program voltage in a forward bias direction, and to be erased to a high resistance state by application of an erase voltage in a reverse bias direction.

In one embodiment, a method of controlling a resistive switching memory device having a plurality of resistive memory cells, can include: (i) determining a command for execution on a selected resistive memory cell, wherein each resistive memory cell comprises: a first diode having an anode coupled to a first word line and a cathode coupled to a common node, a second diode having an anode coupled to the common node and a cathode coupled to a second word line, and a resistive storage element having an anode coupled to a bit line and a cathode coupled to the common node; (ii) in response to the command being a programming operation: setting the first and second word lines for the selected resistive memory cell, and the first word line and the bit line for deselected resistive memory cells, to about 0V, and setting the bit line for the selected resistive memory cell and the second word line for the deselected resistive memory cells to a program voltage plus a threshold voltage; and (iii) in response to the command being an erase operation: setting the first and second word lines for the selected resistive memory cell, and the second word line and the bit line for deselected resistive memory cells, to about an erase voltage plus the threshold voltage, and setting the bit line for the selected resistive memory cell and the first word line for the deselected resistive memory cells to about 0V.

DETAILED DESCRIPTION OF EMBODIMENTS

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device, and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Example CBRAM Cell Structure and Architecture

Particular embodiments may be directed to resistive switching memories (e.g., conductive bridging random-access memory [CBRAM], resistive RAM [ReRAM], etc.). The invention, in its various aspects, will be explained in greater detail below with regard to exemplary embodiments. Particular embodiments can include structures and methods of operating resistive switching memories that can be programmed/written and erased between one or more resistance and/or capacitive states. Resistive switching memory devices can include a plurality of resistive memory cells with "programmable impedance elements" or any type of resistive switching or resistance-change memory cells or elements.

Figure 1:
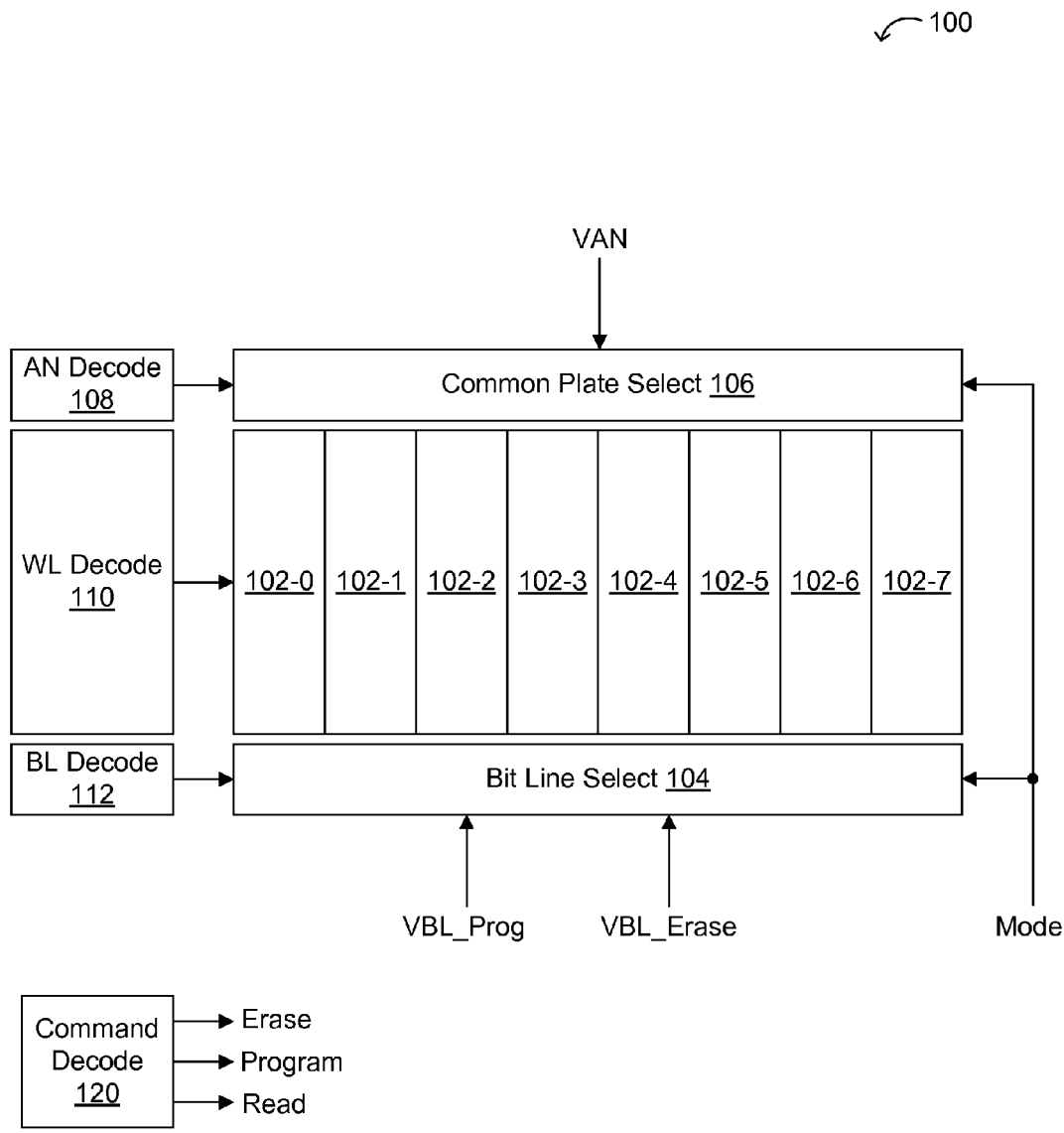
FIG. 1 is an example memory device arrangement.
Figure 2:
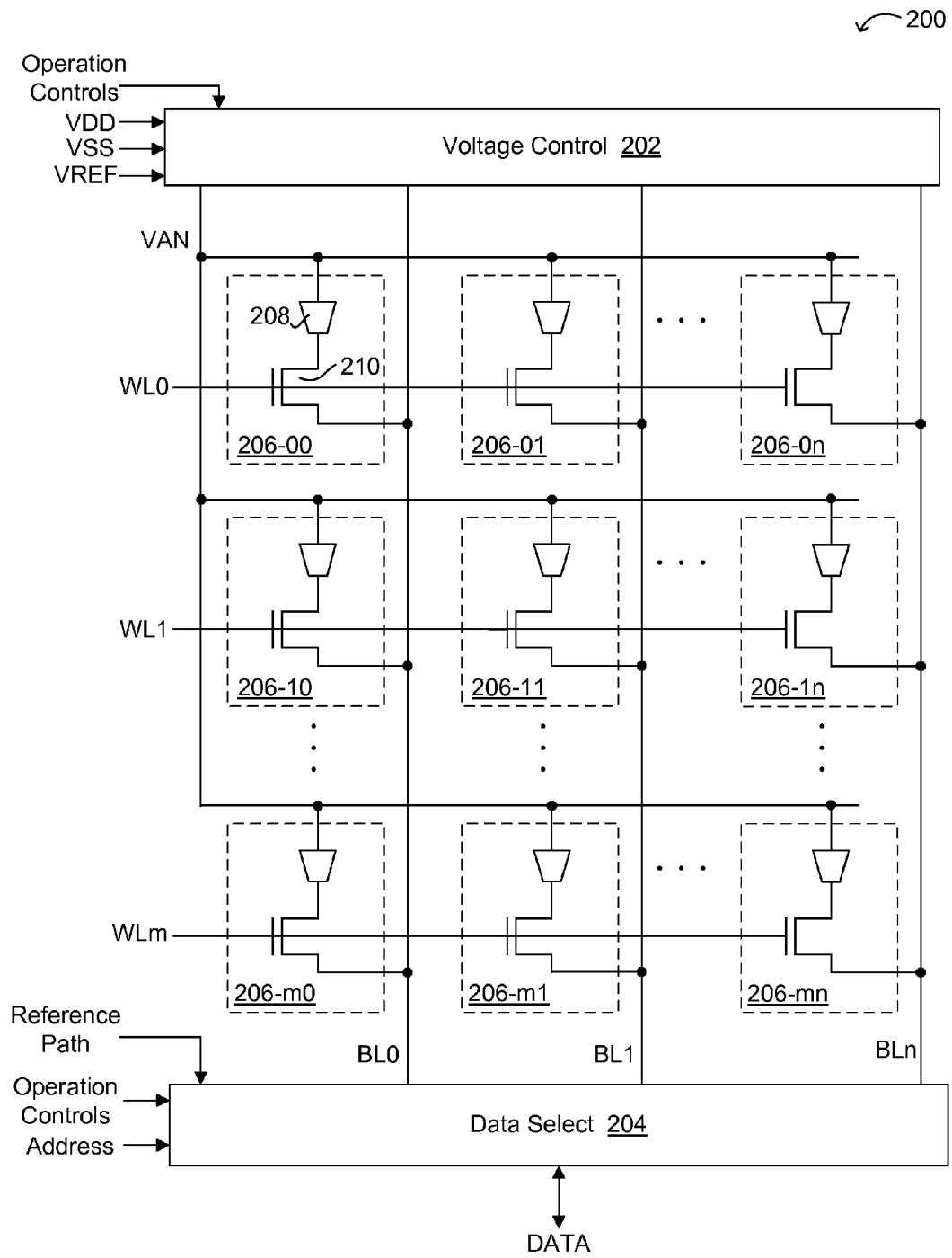
FIG. 2 is a schematic block diagram of an example common anode array structure.

FIGS. 1 and 2 show example memory architectures and circuit structures that can utilize programmable impedance elements. However, particular embodiments are amenable to a wide variety of memory architectures, circuit structures, and types of resistive switching memories.

Referring now to FIG. 1, an example memory device is shown and designated by the general reference character 100. A memory device 100 can include common anode sectors 102-0 to 102-7, bit line selection circuitry 104, common plate selection circuitry 106, anode decoding circuitry 108, word line decoding circuitry 110, and bit line decoding circuitry 112. A memory device 100 can be a single integrated circuit, or may form a portion of a larger integrated circuit device that provides functions in addition to memory, such as in an "embedded" memory configuration.

FIG. 1 may also include command decoding circuitry 120. For example, command decoding circuitry 120 may receive external signals, or control signals derived therefrom, and may generate various internal control signals (e.g., program, erase, read, etc.) in response. Such internal operation control signals can be used to generate various supply levels (e.g., particular program and erase voltage levels), as well as other control signals (e.g., erase operation control signals), as will be discussed in more detail below. In this way, command decoding circuitry 120 may be used to determine an operation to be performed on the device.

Common anode sectors (102-0 to 102-7) can each include a number of memory cells arranged into one or more columns and multiple rows, and coupled to a common anode plate. Each memory cell can include one or more programmable impedance elements or CBRAM storage elements, and a selection device. Generally, a CBRAM storage element may be configured such that when a bias greater than a threshold voltage is applied across electrodes of the CBRAM storage element, the electrical properties of the CBRAM storage element can change. For example, in some arrangements, as a voltage is applied across the electrodes of the CBRAM storage element, conductive ions within an ion conductor may begin to migrate and form an electrodeposit at or near the more negative of the electrodes. Such an electrodeposit, however, is not required to induce a change in electrical properties. The term "electrodeposit" as used herein means any area within the ion conductor that has an increased concentration of reduced metal or other conductive material compared to the concentration of such material in the bulk ion conductor material. As the electrodeposit forms, the resistance between the electrodes can decrease, and other electrical properties may also change. If a voltage is applied in reverse, the electrodeposit can dissolve back into the ion conductor and a device can return to a former electrical state (e.g., high resistance state).

Voltages VBL_Prog, VBL_Erase, and VAN may be conventional power supply voltages, such as +5 and 0 volts, or +3.3 and 0 volts, or +1.2 and 0 volts. In one example, such voltages may be one or more power supply voltages received at an external pin of an integrated circuit including memory device 100. In another example, such voltages may be one or more voltages generated by a voltage regulator of an integrated circuit that includes memory device 100. In any event, such voltages may be used, either directly or indirectly, for programming (e.g., in a forward bias configuration) or erasing (e.g., in a reverse bias configuration) a CBRAM cell by applying suitable voltages across the electrodes thereof.

Bit line selection circuitry 104 can selectively connect bit lines of one or more common anode sections (102-0 to 102-7) according to a mode of operation and bit line decoding values. In one particular example, bit line selection circuitry 104 can advantageously connect a selected bit to either of voltages VBL_Prog or VBL_Erase. That is, in a program operation, a selected bit line can be connected to voltage VBL_Prog, while in an erase operation, a selected bit line can be connected to voltage VBL_Erase.

Common plate selection circuitry 106, can connect anode plates to an inhibit voltage for CBRAM cells that are not selected (e.g., via anode decode 108) for erase or program. It is noted that an arrangement like that shown in FIG. 1 can advantageously provide program and erase voltages without having to include charge pumps or the like, to a voltage that is outside a power supply range, as may exist in other approaches. Instead, supply voltages applied across a selected CBRAM device can be switched between program and erase operations. In this way, program and erase can be "symmetric" operations. That is, in a programming operation, a CBRAM cell to be programmed can be connected between suitable voltages (e.g., V1-V2) in an anode-to-cathode direction. In an erase operation, a CBRAM cell to be erased can be connected between suitable voltages (e.g., V2-V1) in a cathode-to-anode direction.

Bit line decoding circuitry 112 can generate values for selecting given bit lines for read, program, and erase operations. In one arrangement, in response to address information (e.g., column address data), bit line decoding circuitry 112 can generate bit line select signals for application to bit line select circuitry 104. Word line decoding circuitry 110 can generate values for selecting a given set of memory cells by enabling access devices in one or more selected rows of common anode sections (102-0 to 102-7). In response to address information (e.g., row address data), one or more word lines can be driven to a select voltage to thereby enable the corresponding select device (e.g., a transistor) in a row of memory cells.

Referring now to FIG. 2, shown is a schematic block diagram of an example common anode array structure 200, which can be one implementation of the example shown in FIG. 1. In this example, voltage control 202 can receive various supply voltages (e.g., VDD, VSS, VREF, etc.), as well as operation controls (e.g., program, erase, verify, read, etc.). Resistive memory cells 206 can include a programmable impedance element 208 and an access transistor 210, as shown. In this particular arrangement, the anode of each memory cell 206 can connect together in a common anode structure. For example, the common anode can be a large plate structure that may be biased at a voltage VAN generated by voltage control 202. Of course, other voltage generation control and regulated levels, as discussed above, can be utilized in certain embodiments.

In this example, data select 204 can provide an interface between the bit lines (BL0, BL1, . . . BLn) and a data path that is coupled to a sensing or amplification block, as well as to write circuitry. Address decoding can be used to determine which of the bit lines are mapped to the data lines in a particular access cycle. Other types of addressing or decoding (e.g., anode-based decoding) can also be employed. For example, the common anode structure as shown can be broken up into a plurality of sub blocks of common anodes, and each of these may be addressed and decoded. In addition, word line (WL0, WL1, . . . WLm) decoding can be utilized for activation of the appropriate word line for a given cycle.

Further, a reference path can also be coupled to data select 204. The reference path can be used by a sensing circuit in order to compare against a regular bit line. For example, a current from a selected bit line and its selected memory cell 206 can be compared against a current from a reference bit line, where the reference bit line is biased such that appropriate data states on the selected memory cell via the selected bit line can be detected. In one application, the capacitance on the reference bit line and reference memory cell structure can match the capacitance on a regular memory cell/bit line such that these effects are negated during the sensing process.

Other architectures can also be employed with sensing circuitry, arrangements, and methods of particular embodiments. For example, a common cathode structure, whereby a plurality of memory cells are coupled together via a common cathode connection, can be supported. In such a case, the access transistor may connect the anode to the corresponding bit line in a bit line anode arrangement. Also, cathode-based decoding can be used in such an arrangement. Another example architecture or memory cell arrangement is a strapped source structure. In any event, particular embodiments are suitable to a wide variety of resistive memory cell architectures and arrangements.

Data select 204 can also receive operation control signals. These signals can be used to set a read data path, a write data path, and sensing circuitry, as appropriate for the given command. For example, a read data path may be activated for a read operation, a program verify operation, or an erase verify operation. Also, a write data path may be activated for a program or erase operation. For example, a common bidirectional sensing circuit can be employed in each of these operations. In particular, the bidirectional sensing circuit can allow for a program verify to be performed using a same forward bias (anode voltage higher with respect to cathode voltage) on the memory cell as was used to program the memory cell. Similarly, the bidirectional sensing circuit can allow for an erase verify to be performed using a same reverse bias (cathode voltage higher with respect to anode voltage) on the memory cell as was used to erase the memory cell.

Sensing circuits in particular embodiments also aim to minimize disturbance of the accessed cell resistance during the read operation to determine a data state from that cell. Thus, a cell that is programmed (e.g., in a data state "0") should remain in that state after a program verify or standard read operation, and a cell that is erased (e.g., in a data state "1") should remain in that state after an erase verify or standard read operation. The CBRAM cell may generally be programmed with a forward bias voltage (positive with respect to anode and cathode), and may be erased with a reverse bias voltage (negative with respect to anode and cathode). Various voltages for bit lines and the common anode plate can be supported in particular embodiments. Voltages can also be changed depending on the bias direction (forward or reverse) for a read operation.

Having described the various sections of FIG. 2, one example of the operation of such a memory device will now be described with reference to an operation that accesses memory cell 206-00. Initially, word lines WL0, WL1, . . . WLm can be driven to a deselect voltage (e.g., low) by associated word line drivers. Bit line selection circuitry 104 can place bit lines BL0 and BL1 in the deselected state. Similarly, common plate selection circuitry 106 can place common anode plates in the deselect state.

In a program operation, in response to address and mode data, bit line selection signals can be used to connect a selected bit line to read/write control circuitry via data select 204. In contrast, other bit lines can be deselected, and thus placed in the deselected state. Mode selection values can result in read/write control circuitry connecting the selected bit line (e.g., BL0) to a cathode program voltage. A program operation can also include anode plate voltage VAN being connected to a program voltage, while connecting the selected bit line is grounded. A word line driver corresponding to the selected memory cell can be driven to a select voltage, thereby placing the selected memory cell between suitable programming voltages.

An erase operation can occur in the same general fashion, but with the erase voltage being applied to the selected bit line and common anode voltage VAN. As noted in the example of FIG. 1, in particular embodiments, such an operation can be symmetrical. Also, while FIG. 2 shows n-channel MOS transistors 210 as access devices, other embodiments may include different types of access devices. In such alternate embodiments, associated word line drivers would provide appropriate voltage and/or currents to enable such access devices. In this way, bit line selection, anode plate selection, and word line activation can be utilized to program and/or erase a CBRAM array having bit lines connected to cathodes of CBRAMs within multiple memory cells.

While particular example architectures and circuits suitable for CBRAMs, and memory arrays formed thereof, with respect to FIGS. 1 and 2, programmable impedance elements in certain embodiments are suitable to a wide variety of architectures and/or circuit arrangements.

Figure 3:
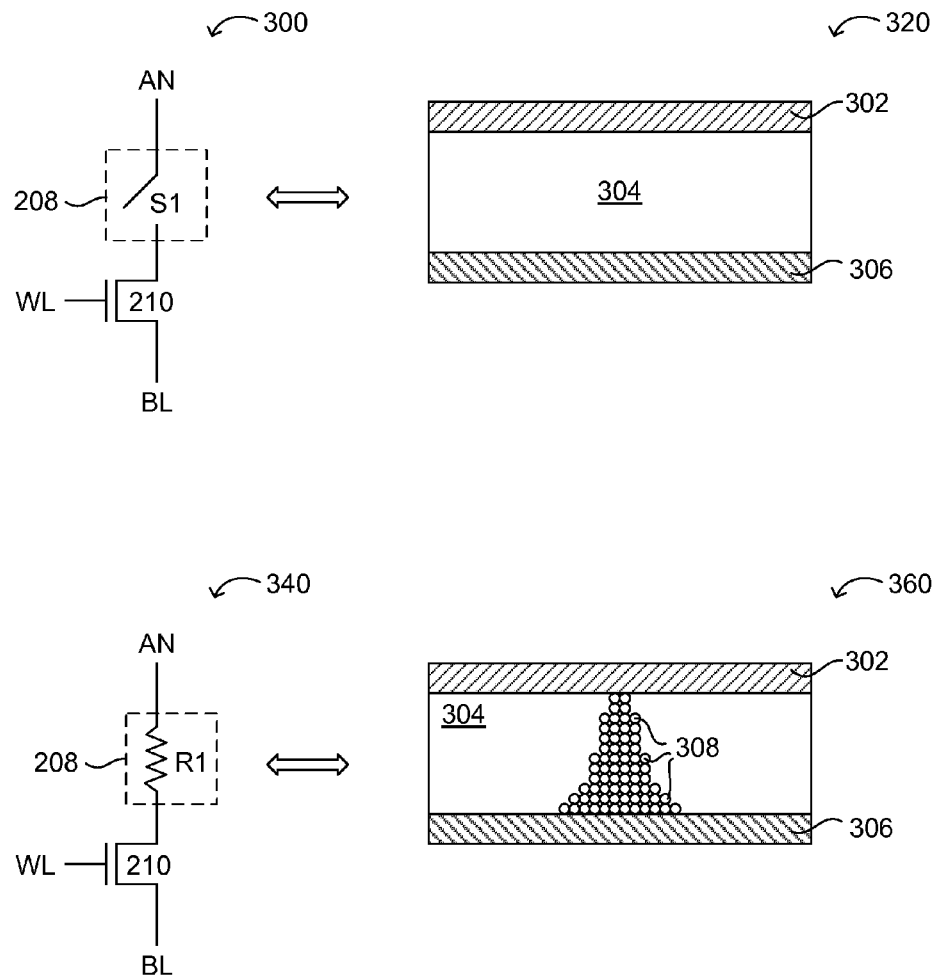
FIG. 3 is a diagram of an example programmable impedance element with schematic modeling.

Referring now to FIG. 3, shown is a diagram of an example programmable impedance element with schematic modeling. For example, example 300 shows a memory cell with an open switch S1 representation of programmable impedance element 208. The programmable impedance element or CBRAM storage element portion of this representation corresponds to the cross-section diagram 320, which represents a resistive storage element in a high impedance state (e.g., data state "1"), or an erased state. Particular embodiments can also include any type of resistive switching or resistance-change memory cells or elements. In one example, CBRAM storage element 320 can include electrochemically active electrode 302, solid electrolyte 304, and inert electrode 306. The example CBRAM storage element 320 may represent a strong or substantially erased state of the cell. As shown, substantially no conductive path between active electrode 302 and inert electrode 306 is seen in CBRAM storage element 320.

Schematic representation 340 and corresponding cross-section diagram 360 show examples of CBRAM storage element 208 in a low impedance state (e.g., data state "0"), or a programmed state. For example, example 340 shows a memory cell with a resistor R1 or closed switch representation of CBRAM storage element 208. The CBRAM storage element portion of this representation corresponds to the cross-section diagram 360. In the example 360, electrodeposits 308 can form in solid electrolyte 304 to form a "bridge" or conductive path between electrochemically active electrode 302 and inert electrode 306 to program the memory cell. For example, electrodeposits 308 can be from active electrode 302, and may include silver, copper, titanium, or tellurium, as just a few examples. As shown in example CBRAM storage element 360, a full conductive path may be formed between active electrode 302 and inert electrode 306 by electrodeposits 308.

As shown in examples 300 and 340, a control transistor (e.g., 210) can also be included in each memory cell including the programmable impedance element or CBRAM storage element 208. For example, transistor 210 can be controlled by a word line, as discussed above with respect to FIG. 2. Transistor 210 may be an access transistor to allow CBRAM storage element 208 to be programmed, read, and erased.

Cell data can be erased in similar fashion to cell programming, but with a positive bias on the inert electrode. The metal ions will then migrate away from the filament, back into the electrolyte, and eventually to the negatively-charged active electrode (e.g., 302). This action dissolves the electrodeposits 308 in solid electrolyte 304, and increases the resistance again (e.g., as shown in schematic representation 300). In this way, an erase operation of a CBRAM storage element may be substantially symmetric to a program operation.

Example CBRAM Cell Sensing and Datapath Structure

Figure 4:
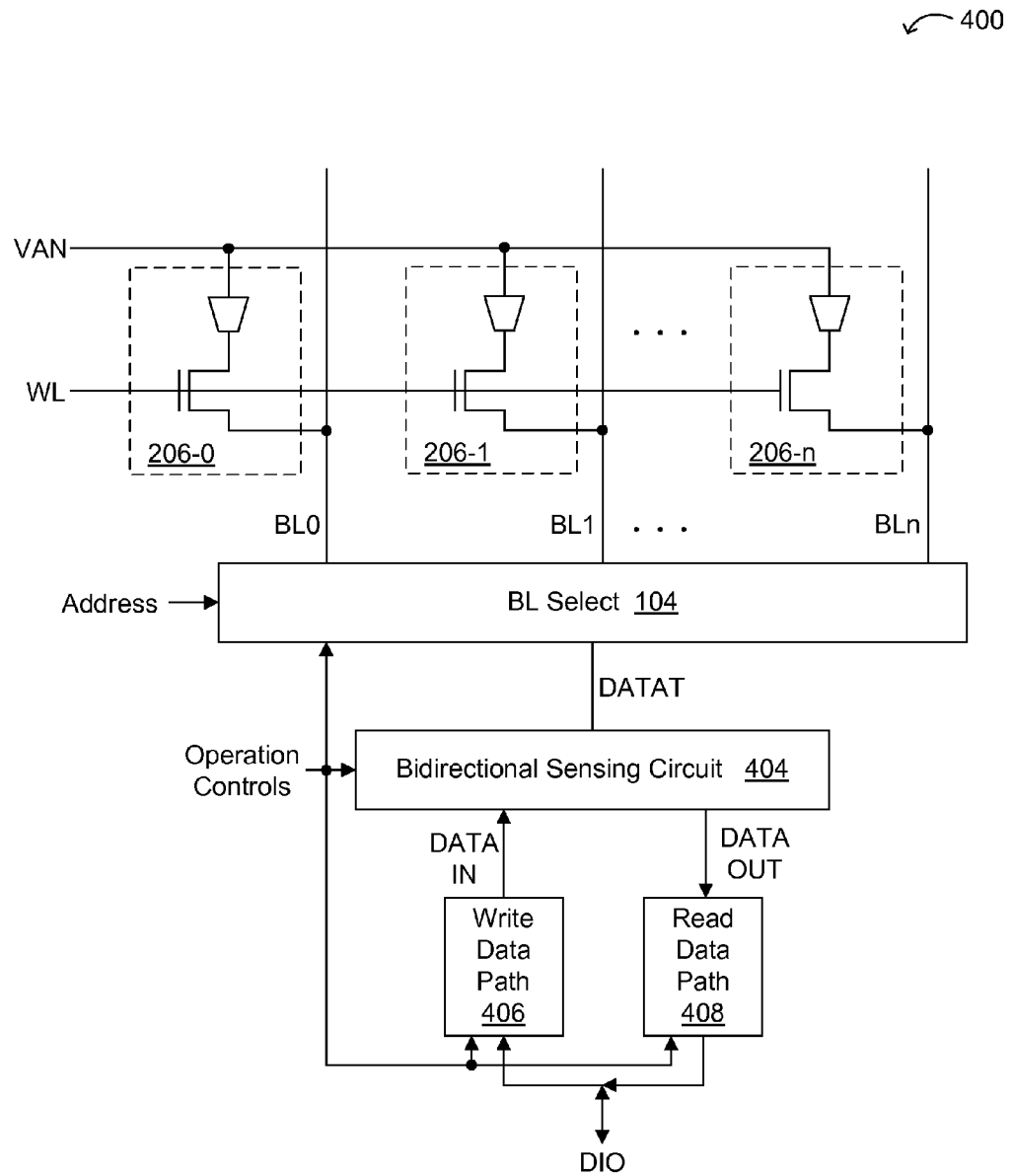
FIG. 4 is a schematic block diagram of an example bidirectional sensing data path arrangement.

Referring now to FIG. 4, shown is a schematic block diagram of an example bidirectional sensing data path arrangement 400, in accordance with embodiments of the present invention. In this example, memory cells 206-0, 206-1, . . . 206-n are shown. In some cases, a reference memory cell can also be included such that a resistance of a selected memory cell can be compared against that of the reference memory cell for read operations. It is understood, however, that other memory cells 206, word lines, and other components and arrangements, are also included. In this particular example, bit line select circuitry 104 can be controlled by address decoding, and may select one of bit lines BL0, BL1, . . . BLn for coupling to bidirectional sensing circuit 404 via DATAT.

Bidirectional sensing circuit 404 can also receive operation control signals. These signals can be used to control activation of read data path 408, write data path 406, and sensing circuitry in circuit 404, as appropriate for the given command. For example, read data path 408 may be activated for a read operation, a program verify operation, or an erase verify operation. Also, write data path 406 may be activated for a program or erase operation. In certain embodiments, common bidirectional sensing circuit 404 can be employed in each of these operations. In particular, bidirectional sensing circuit 404 can allow for a program verify to be performed using a same forward bias (anode voltage higher with respect to cathode voltage) on the memory cell as was used to program the memory cell. Similarly, bidirectional sensing circuit 404 can allow for an erase verify to be performed using a same reverse bias (cathode voltage higher with respect to anode voltage) on the memory cell as was used to erase the memory cell.

The majority of non-volatile memory (NVM) methodologies utilize predetermined program and erase verify levels. This can allow for the read margins to be increased even if there is drift in the program and erase resistance of the memory cell. In some approaches, the same read voltage levels may be maintained, and only the current may be changed. In particular embodiments, the same read or sensing circuit can be used to perform a regular read, as well as program/erase verify operations. Use of the same sensing circuitry for these operations can improve correlation therebetween.

Figure 5:
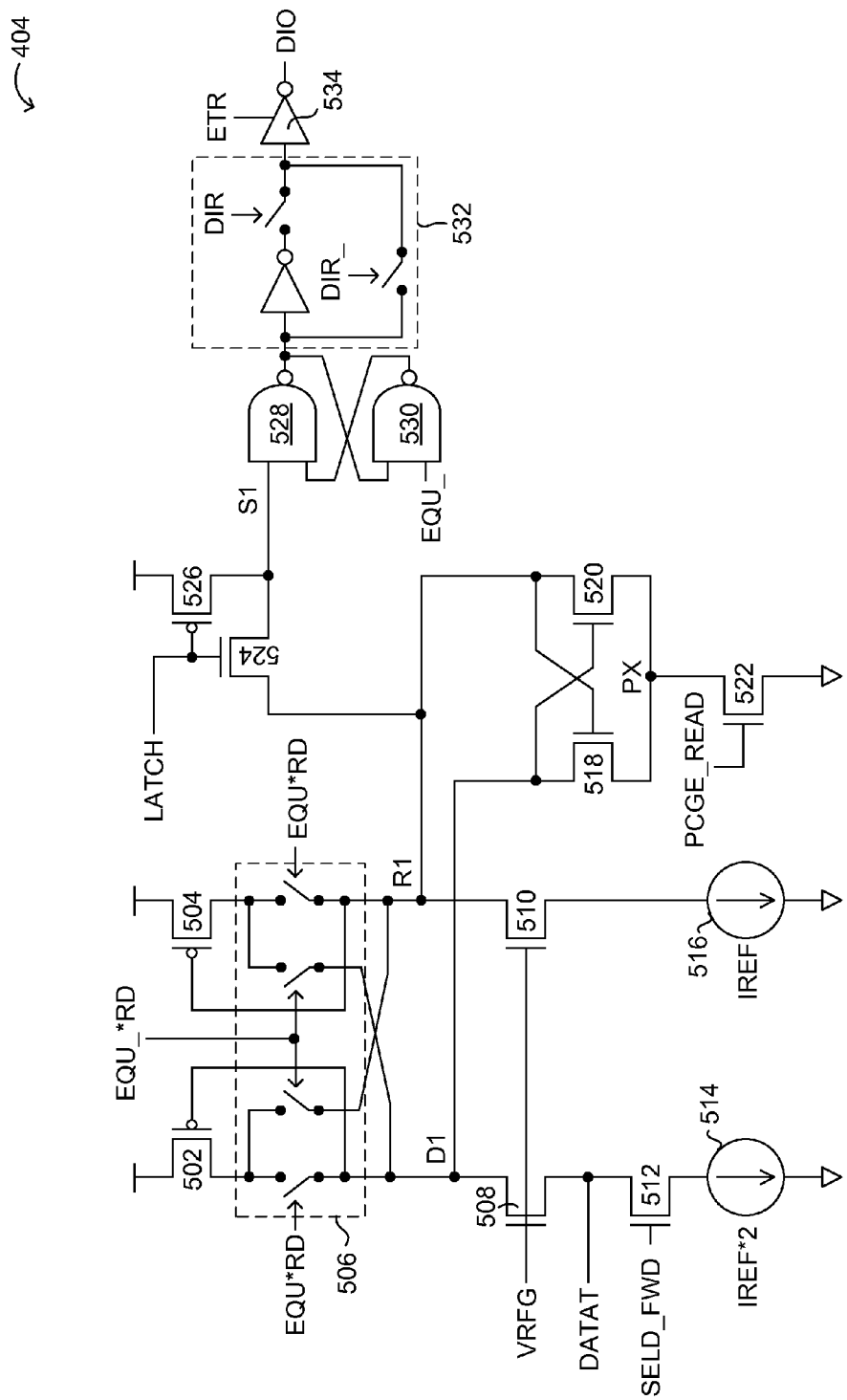
FIG. 5 is a schematic block diagram of an example bidirectional sensing circuit.

Referring now to FIG. 5, shown is a schematic block diagram of an example bidirectional sensing circuit 404 in accordance with embodiments of the present invention. This particular example utilizes a switchable current load and a cross-coupled PMOS load. PMOS transistors 502 and 504 can be diode-connected or cross-coupled depending upon the states of switches 506. NMOS transistors 508 and 510 can be controlled by a reference voltage VRFG, which may be equal to VREF+VGS(IREF). In one application, VRFG can be set globally on the resistive switching memory device. DATAT can be coupled to the memory cell accessed from the memory array.

NMOS transistor 512 can be controlled by direction indicator signal SELD_FWD, and may have its drain connected to DATAT, and its source connected to current source 514 to VSS. For example, current source 514 may be twice IREF, which can be IRF or IPR, and may be set globally on the resistive switching memory device. Similarly, current source 516 can be connected between a source of transistor 510, and VSS. For example, current source 516 may have a current of IREF. Also, direction indicator signal SELD_FWD can indicate whether the read is a forward bias read or a reverse bias read as to the anode and cathode of the programmable impedance element in the accessed memory cell.

Node D1 can connect to a drain of NMOS transistor 518, and a gate of NMOS transistor 520. Node R1 can connect to a drain of transistors 520, and a gate of transistor 518. The sources of transistors 518 and 520 can connect at node PX. Also, NMOS transistor 522 can be connected to node PX at its drain, to VSS at its source, and to control signal PCGE_READ in its gate. For example, control signal PCGE_READ can be used to speed up a read or sensing operation by sinking current at node PX. A latch control signal can connect to the gates of NMOS transistor 524 and PMOS transistor 526. Thus, when the latch control signal is high, the value on node R1 can be allowed to pass through via node S1 to the SR flip-flop formed by NAND-gates 528 and 530. In contrast, when the latch control signal is low, node R1 can be isolated from node S1, which can be pre-charged high via transistor 526.

The output read from sensing circuit 404 can be latched by way of the SR flip-flop, which can be reset when the equalization signal EQU is activated (EQU_is low). For example, equalization signal EQU can allow for the PMOS transistor 502/504 load to be configured as diode-connected transistors at the start of a read operation, and to reset the latch structure including the SR flip-flop. The directionality of the output can be set to the proper polarity by direction control signal DIR and the inverter and switch structure 532. Thus, depending on whether the read was a forward bias read or a reverse bias read, direction control signal DIR and circuitry 532 can be used to provide the appropriate output at DIO via enabled inverter 534.

In particular embodiments, current and/or voltage polarity of the sense amplifier can be inverted for common cathode or bit line anode architectures. The sensing may also be performed with capacitive decay. In any event, margins can be improved by taking advantage of the nonlinear nature of the resistance of resistive memory cells (e.g., CBRAM cells) in order to improve program/erase verify levels. The program verify operation may have a reduced voltage as compared to conventional approaches to reduce resistance levels, and to limit exposure of the memory cell to verify voltages could otherwise cause disturb of the cell data. This may be done even if program/erase reinforcement by way of sensing for verify operations being in the same bias direction as the corresponding program/erase operations were not necessary.

Thus in particular embodiments, a program or erase operation on a resistive memory cell may have a follow-on verify operation that utilizes a read in a same bias direction in which the cell was programmed or erased. Thus, a program verify operation can employ a forward bias (anode with respect to cathode) read, while in erase verify can employ a reverse bias read. In this way, the anode voltage may not have to be switched as much as much as in other approaches, and the forward sensing can be used with a higher reference voltage to maintain a relatively low bias across the memory cell. In addition, reduced anode switching can result in substantial power savings for common anode architectures because the anode is essentially a large common plate with an associated high capacitance.

For erased memory cells, a nonlinear resistance of the memory cell may be seen, and thus a larger voltage may be utilized in the reverse direction to sense in order to verify the erase. In this way, a verify operation with larger currents for the larger resistances of the erased memory cell may be returned to a normal or lower bias for a standard read operation. This is in contrast to approaches that would always read the memory cell in one bias direction. Rather, sensing approaches as described herein can read a memory cell in both bias directions, or either direction based on the particular operation (e.g., program, erase) to verify. For example, to verify a program operation, a special forward read can be employed to verify the program with a higher voltage because the anode may already be at that high voltage from the previous program operation.

For an erase operation, the common anode may be at a ground level to perform the erase, which can be a reverse bias direction. Then, a larger voltage can be applied to the bit line coupled to the cathode to perform the erase verify operation. Thus, a relatively large current can be utilized to verify with as part of the verify operation. Further, that same or a similar current can be employed in a normal read with a lower voltage in the reverse direction to verify because current is exponentially reduced with lower voltage. Thus in some applications, it may be desirable to utilize larger currents in sensing circuitry because smaller currents may be susceptible to noise, and are typically more difficult to generate and to control. Further, the compact sensing circuitry of particular embodiments being applicable for both verify and read operations can save die size.

Figure 6:
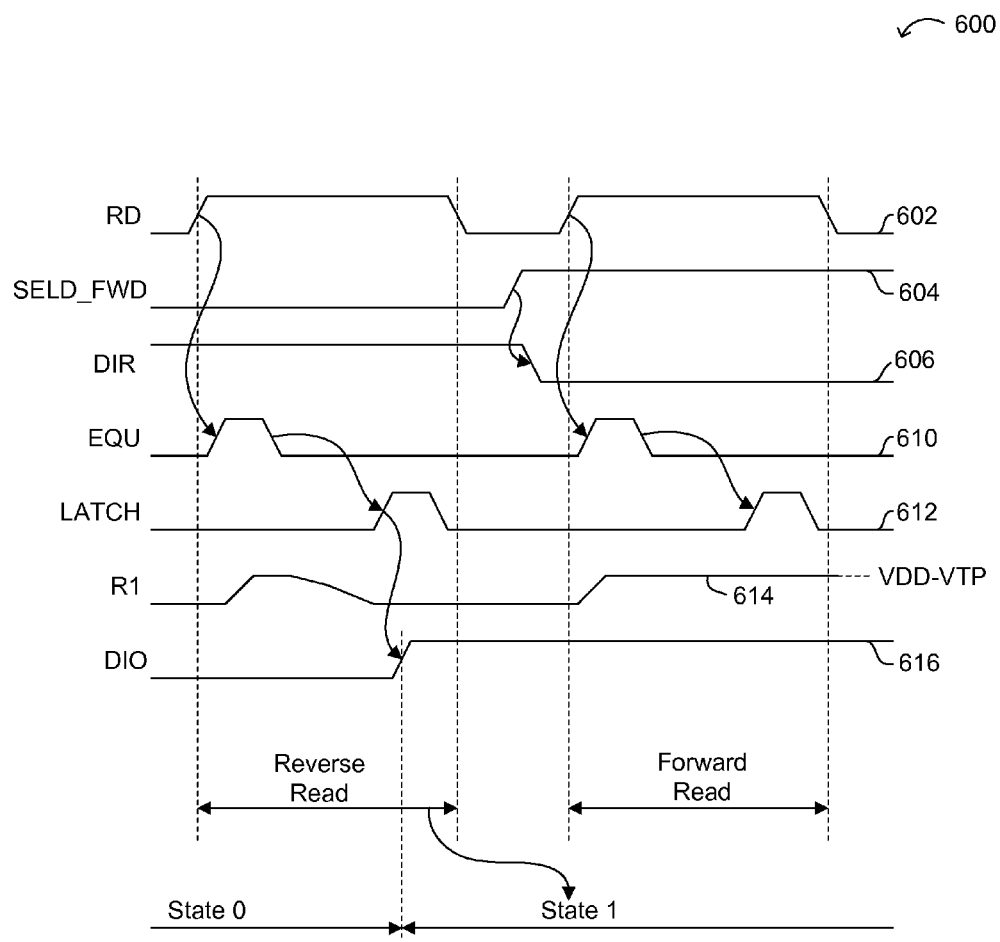
FIG. 6 is a waveform diagram of an example operation of the bidirectional sensing circuit of FIG. 5.

Referring now to FIG. 6, shown is a waveform diagram of an example operation 600 for the bidirectional sensing circuit shown in FIG. 5. In this particular example, the read control signal RD can go high to initiate a read operation, and two read operations are shown in waveform 602. Waveform 604 shows forward read control signal SELD_FWD, which can be low to indicate a reverse bias read, and may be high to indicate a forward bias read. Thus, the first read cycle in this example may be a reverse bias read, while the second read cycle may be a forward bias read. The direction indicator DIR can be high to indicate a reverse polarity, and low to indicate a forward polarity, as shown in waveform 606. Thus, the data can be inverted at DIO when DIR is high.

The equalization control signal EQU can be a high going pulse triggered off a rising edge of the read control signal RD. Thus, as shown in waveform 610, EQU may pulse high to provide a diode load (e.g., via PMOS transistors 502 and 504) at the start of the read cycle, and also to reset the data latch at the output of the sensing circuit. The latch control signal can be a high going pulse delayed from EQU. As shown in example waveform 612, the latch control signal may pulse a delay time away from a falling edge of EQU to allow time for signal development at node R1. As shown in example waveform 614, signal R1 can develop to a low level for the reverse read operation, and to a high level (e.g., VDD-VTP) for the forward read operation. Output signal DIO, as shown in waveform 616, may be low until the latch control signal allows an inversion of the developed signal at R1 to pass through to the latch, and may remain high for the subsequent forward read operation. The data latches may be reset at the end of each operation, and also at circuit power up.

First Example Diode Select Memory Cell

In particular embodiments, a diode select memory cell may be employed in resistive switching memory (e.g., CBRAM) devices. For example, a resistive memory cell can include a resistive storage or programmable impedance element, as well as diodes for selection/access of the resistive storage element. As one example, the diodes can be thin film diodes, and may be manufactured by any suitable thin film process or technology. Thus, an array of resistive memory cells can include thin film diodes configured as access devices, and may exclude transistors from the memory cells. In this way, patterning or fabrication steps can be reduced by being able to pattern all thin film layers potentially in one pass. In other cases, the diodes can be implemented as junctions in bipolar junction transistors (BJTs) or MOS transistors.

In one embodiment, a resistive switching memory device can include a plurality of resistive memory cells, where each of the resistive memory cells includes: (i) a first diode having an anode coupled to a first word line and a cathode coupled to a common node; (ii) a second diode having an anode coupled to the common node and a cathode coupled to a second word line; and (iii) a resistive storage element having an anode coupled to a bit line and a cathode coupled to the common node, wherein the resistive memory cell is configured to be programmed to a low resistance state by application of a program voltage in a forward bias direction (e.g., anode voltage greater than cathode voltage), and to be erased to a high resistance state by application of an erase voltage in a reverse bias direction (e.g., cathode voltage greater than anode voltage).

Figure 7:
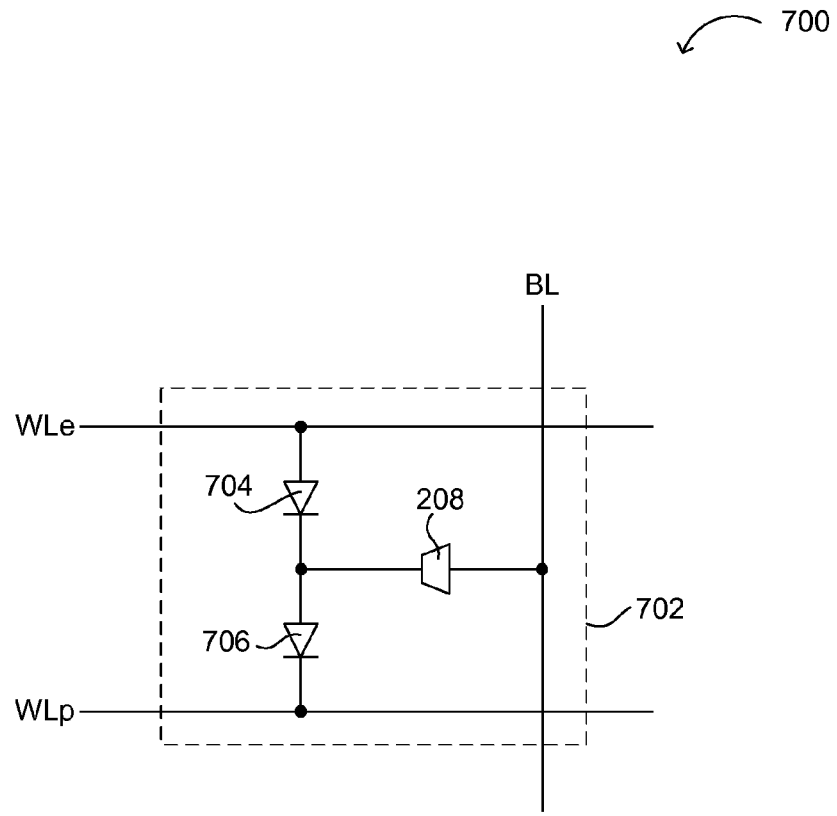
FIG. 7 is a schematic block diagram of a first example diode select resistive switching memory cell in accordance with embodiments of the present invention.

Referring now to FIG. 7, shown is a schematic block diagram of a first example 700 of a diode select resistive switching memory cell in accordance with embodiments of the present invention. In this example, twin word lines WLe and WLp can be utilized, along with bit line BL to select/deselect resistive storage element 208. In some cases, resistive storage element 208 can be the same or similar to CBRAM storage element 208, as discussed above. In other cases, resistive storage element 208 can be implemented in another fashion (e.g., bipolar CBRAM or other programmable impedance element). In any case, resistive storage element 208 can have its resistance, capacitance, and/or impedance changed in response to a voltage applied across its anode and cathode, and the stored state (e.g., resistance level) can be maintained in a nonvolatile fashion once the voltage is removed from the resistive memory cell.

Resistive memory cell 702 can include resistive storage element 208 and diodes 704 and 706. An anode of diode 704 can connect to word line WLe, and a cathode of diode 704 can connect to a common node in resistive memory cell 702. An anode of diode 706 can connect to the common node, and a cathode of diode 706 can connect to word line WLp. An anode of resistive storage element 208 can connect to the bit line BL, and a cathode of resistive storage element 208 can connect to the common node. The pair of word lines WLe and WLp can be shared among other cells arranged along a row of a memory array. Also, bit line BL can be shared among other resistive memory cells arranged along a column of the memory array. Further, any suitable number of rows and columns of such memory cells can be arranged in a resistive switching memory array or device.

Figure 8:
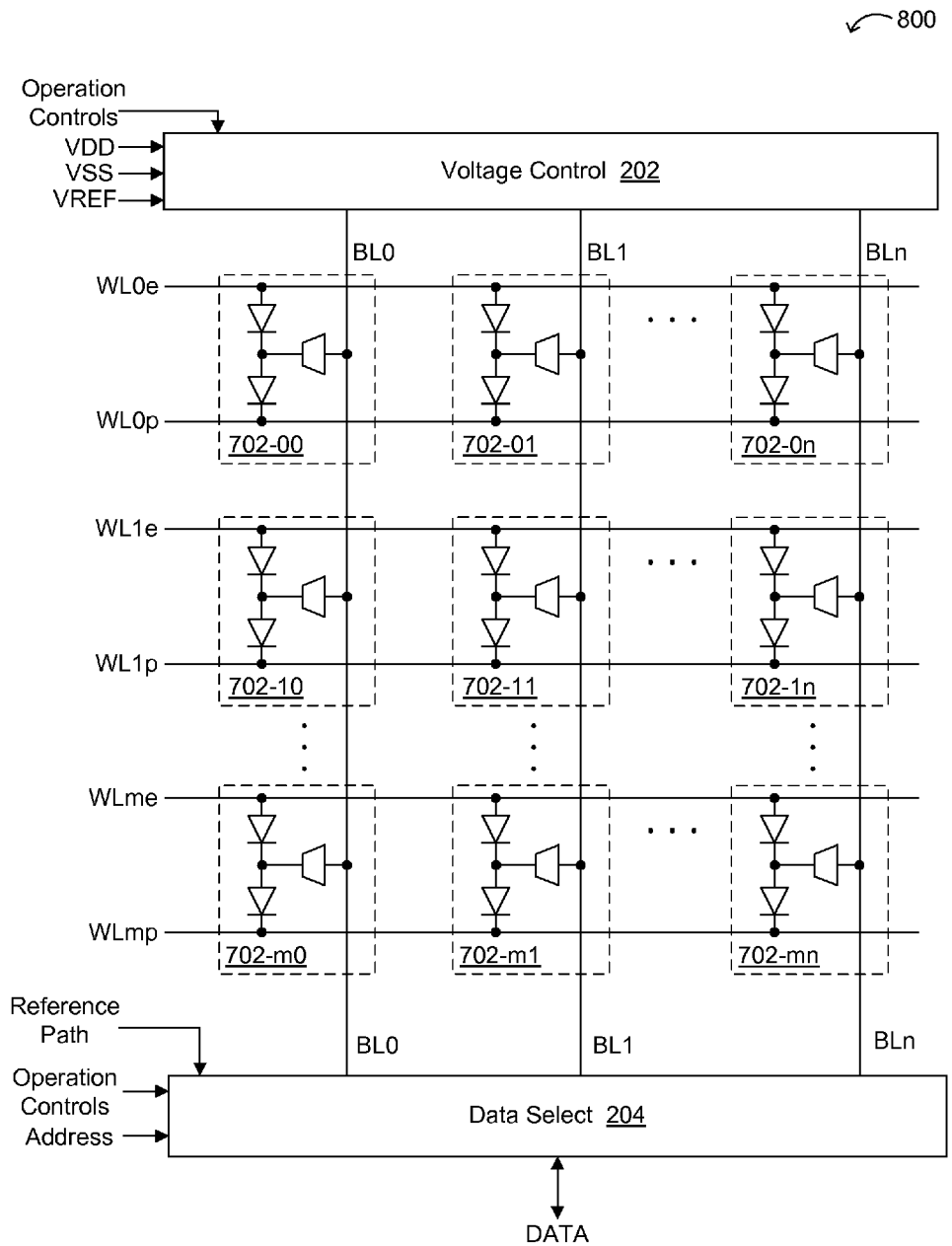
FIG. 8 is a schematic block diagram of an example diode select resistive switching memory array in accordance with embodiments of the present invention.

Referring now to FIG. 8, shown is a schematic block diagram 800 of an example diode select resistive switching memory array in accordance with embodiments of the present invention. In this example array structure, "m" rows of memory cells may run horizontally, and "n" columns of memory cells may run vertically. As will be discussed in more detail below, word lines WL0e, WL0p, WL1e, WL1p, . . . WLme, WLmp, can be driven to select or deselect voltages by associated word line drivers. Deselect voltages in particular embodiments can be such voltages to reverse bias diodes 704 and 706, or to otherwise ensure that such diodes are off, in resistive memory cell 702. For example, the "e" word lines may generally be driven to a low (e.g., about 0V) voltage level, and the "p" word lines may generally be driven to a high (e.g., greater than a threshold or Vbe voltage), in order to deselect a given word line.

Bit line selection circuitry 104 can place bit lines BL0, BL1, . . . BLn in the deselected state, such as by driving a bit lines low (e.g., about 0V), or may be configured to select a bit line in order to facilitate a given operation (e.g., program, erase, read). Also, common plate selection circuitry (e.g., 106) may be combined with bit line selection circuitry (e.g., 104) in this architecture because the resistive storage elements are connected along or by bit lines, and thus any common anode plate can be arranged along a common bit line. Of course, other array arrangements or organizations, such as different numbers of rows or columns, can also be supported in particular embodiments.

In a program operation, in response to address and mode data, word line and bit line selection signals can be used to connect a selected word line and bit line to read/write control circuitry via data select 204, and/or word line drivers. Also, other word lines and bit lines can be deselected, and thus be placed in the deselected state. The deselected state in terms of the particular voltages applied to each associated word line and bit line may vary based on the particular mode of operation. For example, mode selection values can result in read/write control circuitry connecting the selected bit line (e.g., BL0) to a program voltage plus a threshold voltage. Word line drivers corresponding to word lines for the selected memory cell can be driven to appropriate select voltages, thereby placing the selected memory cell between suitable programming voltages after accounting for diode drop voltages.

An erase operation can occur in the same general fashion, but with a ground voltage being applied to the selected bit line, and different values (e.g., the erase voltage plus a threshold) in some cases being driven on the corresponding word lines. As noted in the example of FIG. 1, in particular embodiments, such an operation can be symmetrical. In certain embodiments, associated word line drivers can provide appropriate voltages and/or currents to enable diodes 704 and 706 to be controlled such that a suitable bias voltage can be applied across resistive storage element 208. In this way, bit line or anode selection, as well as word line activation, can be utilized to program and/or erase memory cells in a resistive memory (e.g., CBRAM) array having bit lines connected to anodes of resistive storage elements. As will be discussed below, the word lines and bit lines of the array can be configured in order to execute a given command (e.g., program, erase, read) on a selected memory cell, while substantially avoiding or minimizing disturb of other (deselected) memory cells.

Figure 9:
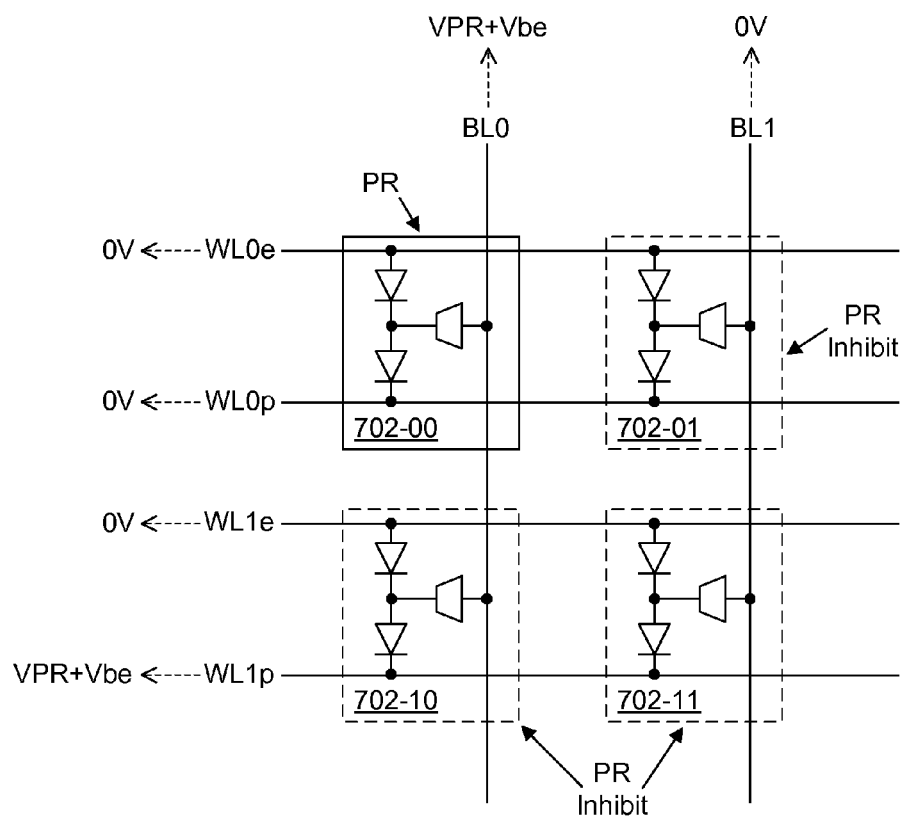
FIG. 9 is a schematic block diagram of an example diode select resistive memory cell program operation in accordance with embodiments of the present invention.

Referring now to FIG. 9, shown is a schematic block diagram 900 of an example diode select resistive memory cell program operation in accordance with embodiments of the present invention. In this particular example, resistive memory cell 702-00 can be selected and programmed (PR), while memory cells 702-01, 702-10, and 702-11 can be deselected and program inhibited such that the resistive storage elements in those cells are not disturbed by programming the selected cell. In this example, word lines WL0e and WL0p corresponding to the row of selected memory cell 702-00 can be driven low (e.g., to about 0V). Also, bit line BL0 corresponding to the column of selected memory cell 702-00 can be driven to a high level (e.g., about VPR+Vbe). For example, VPR (e.g., about 2.0V) can represent a voltage sufficient to program resistive storage element 208 when applied across the anode and cathode thereof, and Vbe (e.g., about 600 mV) can represent a threshold voltage sufficient to turn on one of diodes 704 or 706. In this case, Vbe can be sufficient to turn on diode 706 to allow for VPR to be applied across the anode and cathode of resistive storage element 208 in order to program the selected memory cell.

For the deselected row, word lines WL1e can also be driven low (e.g., to about 0V), and WL1p can be driven to a high level (e.g., VPR+Vbe). This can ensure that neither of diodes 704 and 706 may be turned on for memory cells 702 (e.g., 702-10 and 702-11) along the deselected rows. Also, memory cell 702-01 can be program inhibited even though its word lines WL0e and WL0p are low because bit line BL1 is also low (e.g., about 0V). Thus, a programming voltage may not be developed across the anode and cathode of resistive storage element 208 in memory cell 702-01. In this way, selected memory cell 702-00 can be programmed, while deselected memory cells 702-01, 702-10, and 702-11 can remain in an unchanged or undisturbed state.

Figure 10:
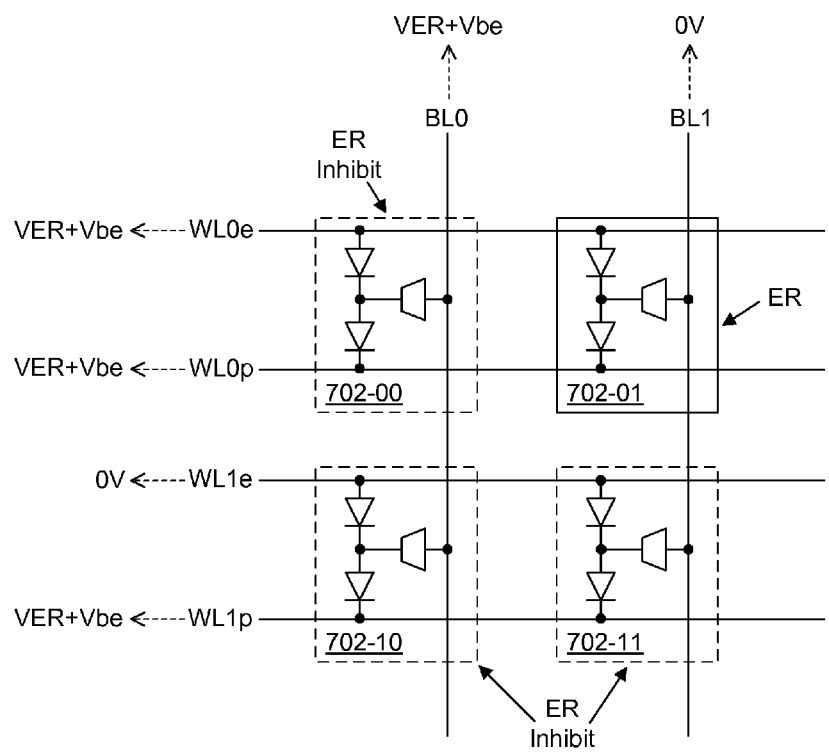
FIG. 10 is a schematic block diagram of an example diode select resistive memory cell erase operation in accordance with embodiments of the present invention.

Referring now to FIG. 10, shown is a schematic block diagram 1000 of an example diode select resistive memory cell erase operation in accordance with embodiments of the present invention. In this particular example, resistive memory cell 702-01 can be selected and erased (ER), while memory cells 702-00, 702-10, and 702-11 can be deselected and erase inhibited such that the resistive storage elements in those cells are not disturbed by erasing the selected cell. In this example, word lines WL0e and WL0p corresponding to the row of selected memory cell 702-01 can be driven high (e.g., to about VER+Vbe). Also, bit line BL1 corresponding to the column of selected memory cell 702-01 can be driven to a low level (e.g., about 0V). For example, VER (e.g., about 1.4V or about 2.0V) can represent a voltage sufficient to erase resistive storage element 208 when applied across the cathode and anode thereof, and Vbe (e.g., about 600 mV) can represent a threshold voltage sufficient to turn on one of diodes 704 or 706. In this case, Vbe can be sufficient to turn on diode 704 to allow for VER to be applied in reverse bias across the anode and cathode of resistive storage element 208 in order to erase the selected memory cell.

For the deselected row, word lines WL1e can also be driven low (e.g., to about 0V), and WL1p can be driven to a high level (e.g., about VER+Vbe). This can ensure that neither of diodes 704 and 706 may be turned on for memory cells 702 (e.g., 702-10 and 702-11) along the deselected rows. Also, memory cell 702-00 can be erase inhibited even though its word lines WL0e and WL0p are high because bit line BL0 may also be high (e.g., about VER+Vbe). Thus, an erase voltage may not be developed across the cathode and anode of resistive storage element 208 in memory cell 702-00. In this way, selected memory cell 702-01 can be erased, while deselected memory cells 702-00, 702-10, and 702-11 can remain in an unchanged (undisturbed) state.

Figure 11:
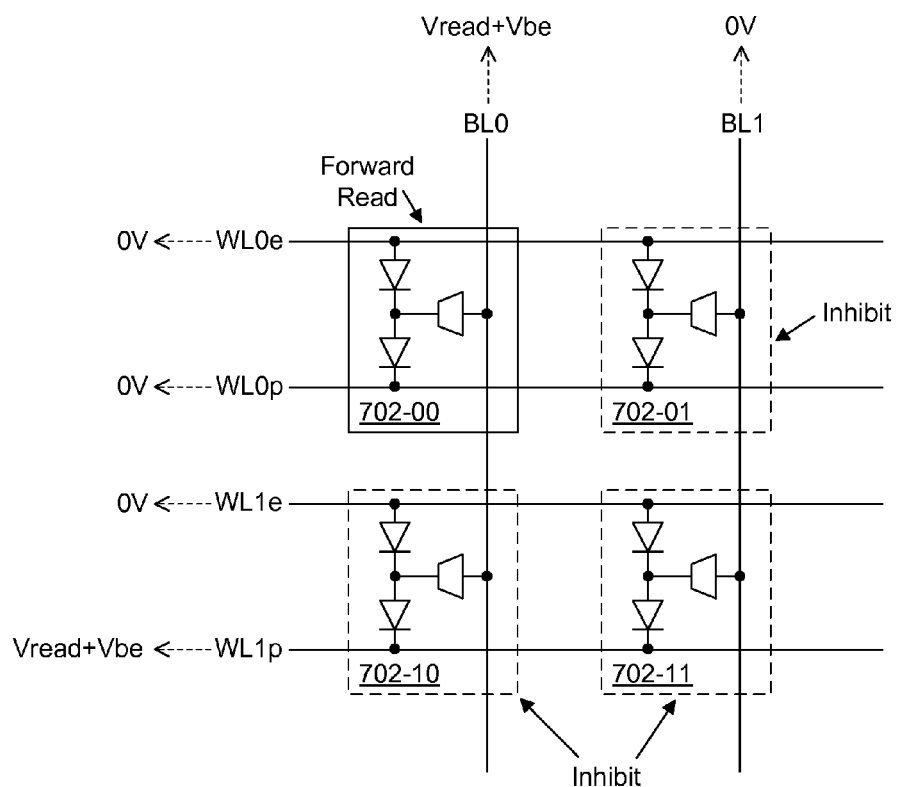
FIG. 11 is a schematic block diagram of an example diode select resistive memory cell forward read operation in accordance with embodiments of the present invention.

Referring now to FIG. 11, shown is a schematic block diagram 1100 of an example diode select resistive memory cell forward read operation in accordance with embodiments of the present invention. As discussed above, bidirectional sensing circuit 404 can be employed to read a state of a resistive memory cell in either a forward bias (forward read) or a reverse bias (reverse read) configuration. In this way, power savings due to signal line swings on word lines and bit lines for program and erase verify operations can be reduced in many applications. Thus, whether a forward read (e.g., FIG. 11) or a reverse read (see, e.g., FIG. 12) is employed to execute a read command or as part of a program or erase algorithm can be determined based on whether the read operation is being used for a program verify (forward read) or an erase verify (reverse read) operation.

In this particular example, resistive memory cell 702-00 can be selected and read, while memory cells 702-01, 702-10, and 702-11 can be deselected and inhibited such that the resistive storage elements in those cells are not disturbed by reading the selected cell. In this example, word lines WL0e and WL0p corresponding to the row of selected memory cell 702-00 can be driven low (e.g., about 0V). Also, bit line BL0 corresponding to the column of selected memory cell 702-00 can be driven to a high level (e.g., about Vread+Vbe). For example, Vread (e.g., about 200 mV) can represent a voltage sufficient to read or sense a state of resistive storage element 208 when applied across the anode and cathode thereof, and Vbe (e.g., about 600 mV) can represent a threshold voltage sufficient to turn on one of diodes 704 or 706. In this case, Vbe can be sufficient to turn on diode 706 to allow for Vread to be applied across the anode and cathode of resistive storage element 208 in order to sense the selected memory cell.

For the deselected row, word lines WL1e can also be driven low (e.g., to about 0V), and WL1p can be driven to a high level (e.g., Vread+Vbe). This can ensure that neither of diodes 704 and 706 may be turned on for memory cells 702 (e.g., 702-10 and 702-11) along the deselected row. Also, memory cell 702-01 can be read inhibited even though its word lines WL0e and WL0p are low because bit line BL1 is also low (e.g., about 0V). Thus, a read voltage may not be developed across the anode and cathode of resistive storage element 208 in memory cell 702-01. In this way, selected memory cell 702-00 can be sensed, while deselected memory cells 702-01, 702-10, and 702-11 can remain undisturbed.

Figure 12:
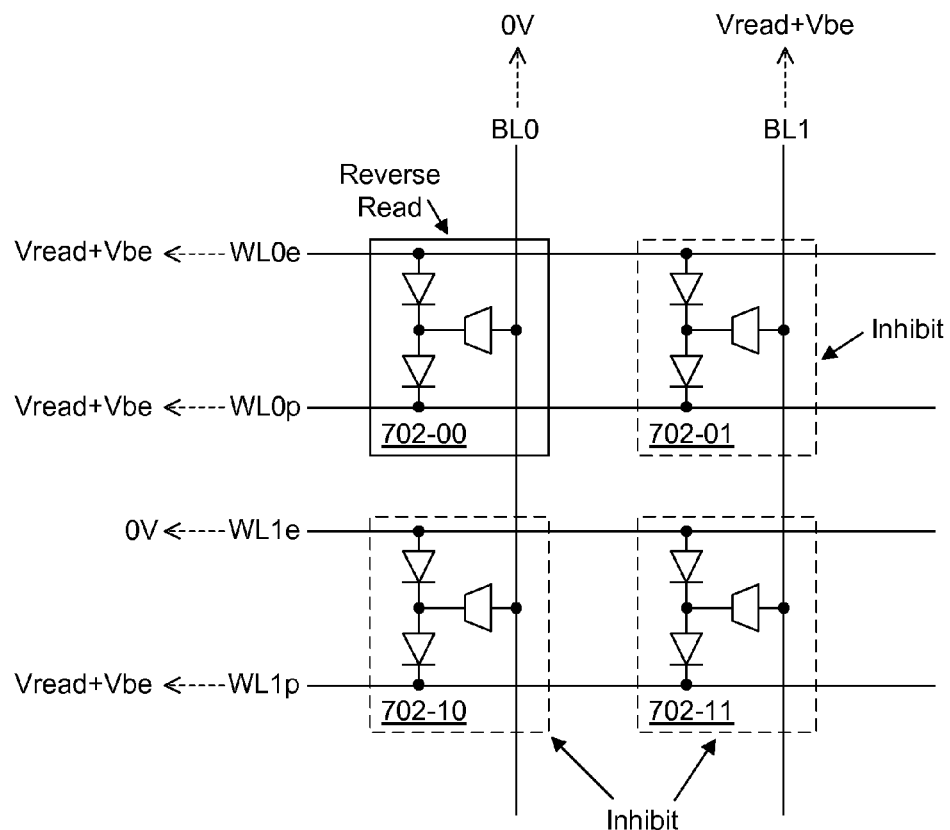
FIG. 12 is a schematic block diagram of an example diode select resistive memory cell reverse read operation in accordance with embodiments of the present invention.

Referring now to FIG. 12, shown is a schematic block diagram 1200 of an example diode select resistive memory cell reverse read operation in accordance with embodiments of the present invention. Also in this example, resistive memory cell 702-00 can be selected and read, while memory cells 702-01, 702-10, and 702-11 can be deselected and inhibited such that the resistive storage elements in those cells are not disturbed by reading the selected cell. In this example, word lines WL0e and WL0p corresponding to the row of selected memory cell 702-00 can be driven high (e.g., to about Vread+Vbe), and bit line BL0 corresponding to the column of selected memory cell 702-00 can be driven to a low level (e.g., about 0V). For the deselected row, word lines WL1e can also be driven low (e.g., to about 0V), and WL1p can be driven to a high level (e.g., about Vread+Vbe) to ensure that neither of diodes 704 and 706 may be turned on for memory cells 702 (e.g., 702-10 and 702-11) along the deselected row. Also, memory cell 702-01 can be read inhibited even though its word lines WL0e and WL0p are high because bit line BL1 is also high (e.g., about Vread+Vbe). Thus, a read voltage may not be developed across the cathode and anode of resistive storage element 208 in memory cell 702-01. In this way, selected memory cell 702-00 can be sensed in a reverse bias read, while deselected memory cells 702-01, 702-10, and 702-11 can remain undisturbed.

In one embodiment, a method of controlling a resistive switching memory device having a plurality of resistive memory cells, can include: (i) determining a command for execution on a selected resistive memory cell, wherein each resistive memory cell comprises: a first diode having an anode coupled to a first word line and a cathode coupled to a common node, a second diode having an anode coupled to the common node and a cathode coupled to a second word line, and a resistive storage element having an anode coupled to a bit line and a cathode coupled to the common node; (ii) in response to the command being a programming operation: setting the first and second word lines for the selected resistive memory cell, and the first word line and the bit line for deselected resistive memory cells, to about 0V, and setting the bit line for the selected resistive memory cell and the second word line for the deselected resistive memory cells to a program voltage plus a threshold voltage; and (iii) in response to the command being an erase operation: setting the first and second word lines for the selected resistive memory cell, and the second word line and the bit line for deselected resistive memory cells, to about an erase voltage plus the threshold voltage, and setting the bit line for the selected resistive memory cell and the first word line for the deselected resistive memory cells to about 0V.

Figure 13:
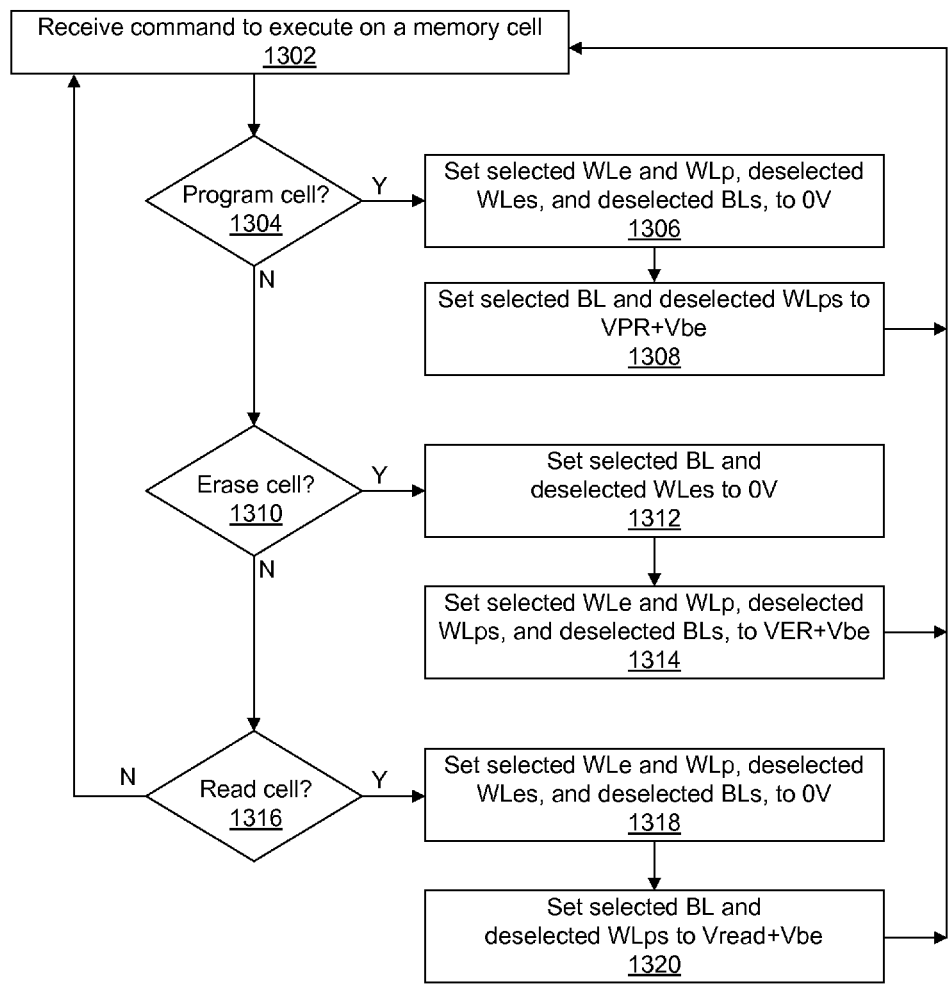
FIG. 13 is a flow diagram of an example method of controlling a diode select resistive memory device, in accordance with embodiments of the present invention.

Referring now to FIG. 13, shown is a flow diagram of an example method 1300 of operating a diode select resistive memory device, in accordance with embodiments of the present invention. At 1302, a command to be executed on a resistive memory cell can be received. For example, command decoder 120 can provide an indication of whether the command is a program, erase, or read (e.g., program verify or erase verify) command. At 1304, if a cell is to be programmed, at 1306, selected word lines WLe and WLp, along with deselected WLes and deselected bit lines can be set to about 0V. At 1308, selected bit lines and deselected word lines WLps can be set to about VPR+Vbe. In this way, a selected resistive memory cell at an intersection of selected word lines and bit lines can be programmed, while deselected memory cells are not disturbed by such a program operation.

At 1310, if a cell is to be erased, at 1312, a selected bit line and deselected word lines WLes can be set to about 0V. At 1314, selected word lines WLe and WLp, deselected word lines WLps, and deselected bit lines can be set to about VER+Vbe. In this way, a selected resistive memory cell at an intersection of selected word lines and bit lines can be erased, while deselected memory cells are not disturbed by such an erase operation.

At 1316, if a cell is to be read (e.g., for a program verify), at 1318, selected word lines WLe and WLp, along with deselected WLes and deselected bit lines can be set to about 0V. At 1320, selected bit lines and deselected word lines WLps can be set to about Vread+Vbe. In this way, a selected resistive memory cell at an intersection of selected word lines and bit lines can be sensed, while deselected memory cells are not disturbed by such a read operation. While a forward read operation is described in this particular example, the read operation can be configured as a forward read (see, e.g., FIG. 11) or as a reverse read (see, e.g., FIG. 12). For example, a program verify operation can include a forward read, while an erase verify operation can include a reverse read.

Second Example Diode Select Memory Cell

While the above examples of diode select memory cells show a resistive storage element anode connected to bit line arrangement, particular embodiments also support an alternative arrangement whereby a cathode of the resistive storage element is connected to the bit line. As in the examples above, a resistive memory cell can include a resistive storage or programmable impedance element, as well as diodes for selection/access of the resistive storage element. The diodes can be thin film diodes, and may be manufactured by any suitable thin film process or technology. An array of resistive memory cells can include thin film diodes configured as access devices, and may exclude transistors from the memory cells. In this way, patterning or fabrication steps can be reduced by being able to pattern all thin film layers potentially in one pass. In other cases, the diodes can be implemented as junctions in bipolar junction transistors (BJTs) or MOS transistors.

In one embodiment, a resistive switching memory device can include a plurality of resistive memory cells, where each of the resistive memory cells includes: (i) a first diode having an anode coupled to a first word line and a cathode coupled to a common node; (ii) a second diode having an anode coupled to the common node and a cathode coupled to a second word line; and (iii) a resistive storage element having a cathode coupled to a bit line and an anode coupled to the common node, wherein the resistive memory cell is configured to be programmed to a low resistance state by application of a program voltage in a forward bias direction (e.g., anode voltage greater than cathode voltage), and to be erased to a high resistance state by application of an erase voltage in a reverse bias direction (e.g., cathode voltage greater than anode voltage).

Figure 14:
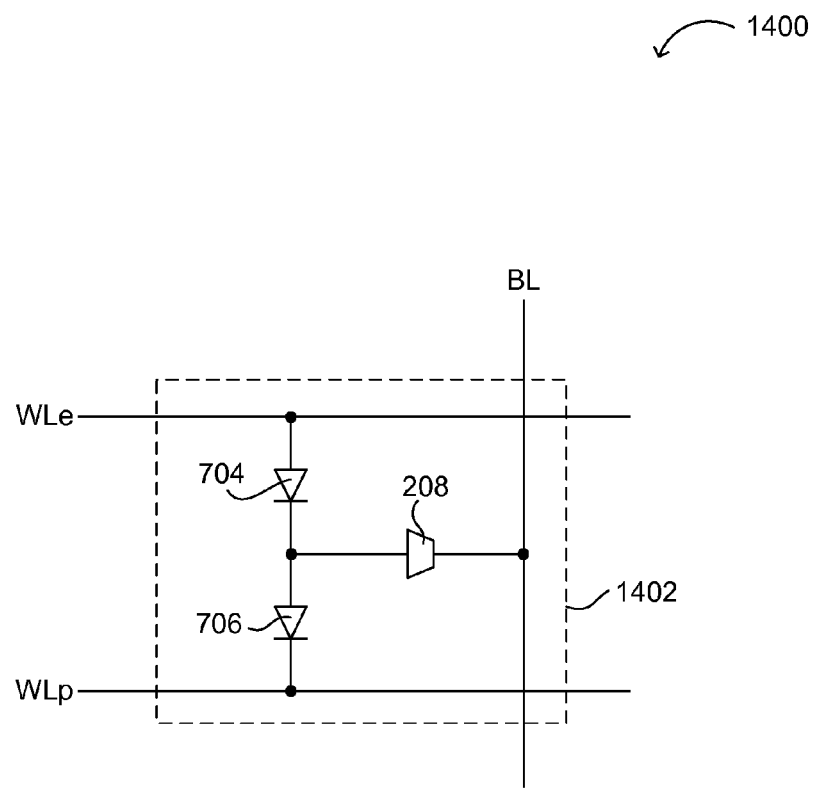
FIG. 14 is a schematic block diagram of a second example diode select resistive switching memory cell in accordance with embodiments of the present invention.

Referring now to FIG. 14, shown is a schematic block diagram of an example 1400 of a diode select resistive switching memory cell, in accordance with embodiments of the present invention. In this example, twin word lines WLe and WLp can be utilized, along with bit line BL to select/deselect resistive storage element 208. In some cases, resistive storage element 208 can be the same or similar to CBRAM storage element 208, as discussed above. In other cases, resistive storage element 208 can be implemented in another fashion (e.g., bipolar CBRAM or other programmable impedance element). In any case, resistive storage element 208 can have its resistance, capacitance, and/or impedance changed in response to a voltage applied across its anode and cathode, and the stored state (e.g., resistance level) can be maintained in a nonvolatile fashion once the voltage is removed from the resistive memory cell.

Resistive memory cell 1402 can include resistive storage element 208 and diodes 704 and 706. An anode of diode 704 can connect to word line WLe, and a cathode of diode 704 can connect to a common node in resistive memory cell 702. An anode of diode 706 can connect to the common node, and a cathode of diode 706 can connect to word line WLp. A cathode of resistive storage element 208 can connect to the bit line BL, and an anode of resistive storage element 208 can connect to the common node. The pair of word lines WLe and WLp can be shared among other cells arranged along a row of a memory array. Also, bit line BL can be shared among other resistive memory cells arranged along a column of the memory array. Further, any suitable number of rows and columns of such memory cells can be arranged in a resistive switching memory array or device.

Figure 15:
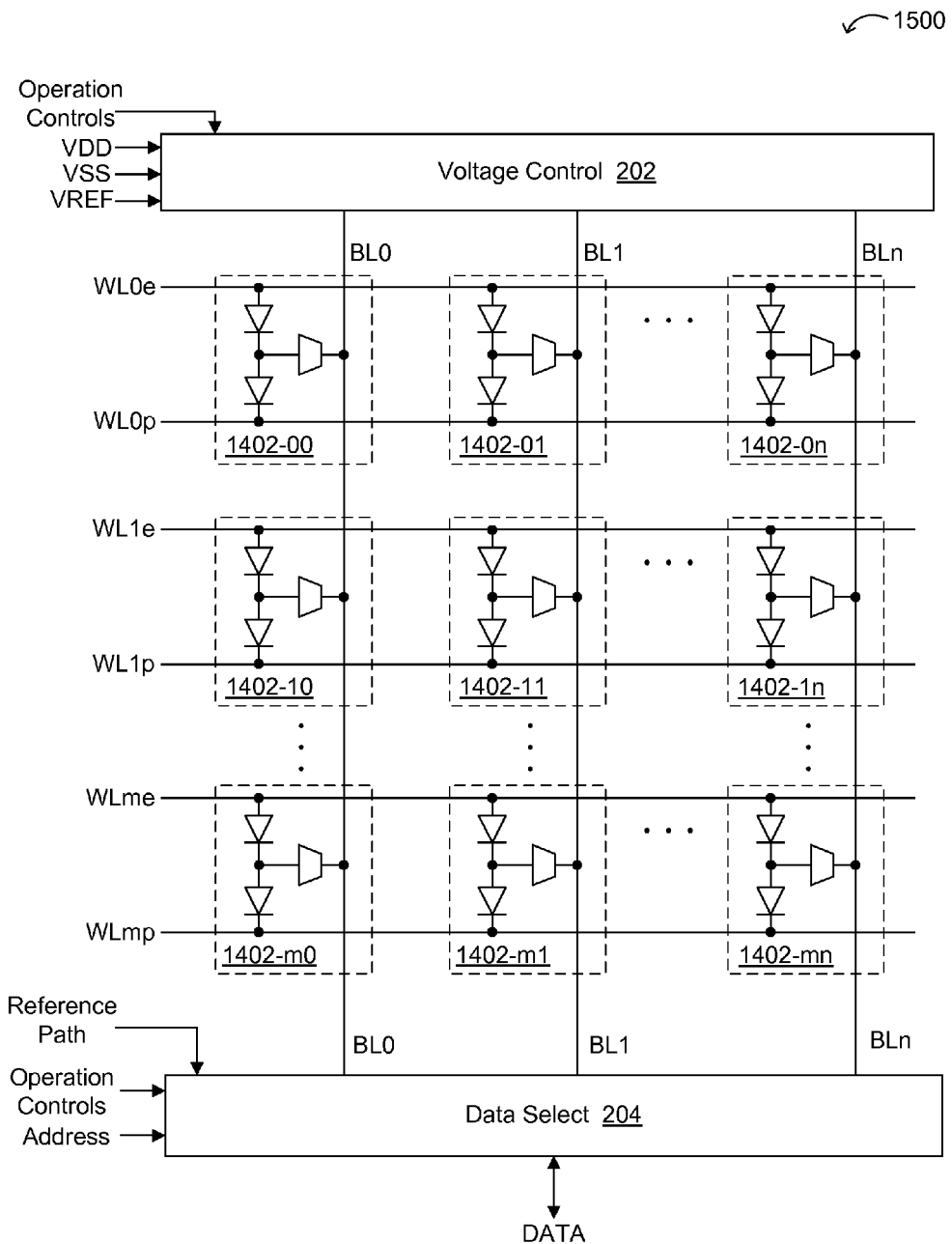
FIG. 15 is a schematic block diagram of an example diode select resistive switching memory array in accordance with embodiments of the present invention.

Referring now to FIG. 15, shown is a schematic block diagram 1500 of an example diode select resistive switching memory array in accordance with embodiments of the present invention. In this example array structure, "m" rows of memory cells may run horizontally, and "n" columns of memory cells may run vertically. As will be discussed in more detail below, word lines WL0e, WL0p, WL1e, WL1p, . . . WLme, WLmp, can be driven to select or deselect voltages by associated word line drivers. Deselect voltages in particular embodiments can be such voltages to reverse bias diodes 704 and 706, or to otherwise ensure that such diodes are off, in resistive memory cell 1402. For example, the "e" word lines may generally be driven to a low (e.g., about 0V) voltage level, and the "p" word lines may generally be driven to a high (e.g., greater than a threshold or Vbe voltage), in order to deselect a given word line.

Bit line selection circuitry 104 can place bit lines BL0, BL1, . . . BLn in the deselected state, such as by driving a bit lines low (e.g., about 0V), or may be configured to select a bit line in order to facilitate a given operation (e.g., program, erase, read). Also, common plate selection circuitry (e.g., 106) may be combined with bit line selection circuitry (e.g., 104) in this architecture because the resistive storage elements are connected along or by bit lines, and thus any common anode plate can be arranged along a common bit line. Of course, other array arrangements or organizations, such as different numbers of rows or columns, can also be supported in particular embodiments.

In a program operation, in response to address and mode data, word line and bit line selection signals can be used to connect a selected word line and bit line to read/write control circuitry via data select 204, and/or word line drivers. Also, other word lines and bit lines can be deselected, and thus be placed in the deselected state. The deselected state in terms of the particular voltages applied to each associated word line and bit line may vary based on the particular mode of operation. For example, mode selection values can result in read/write control circuitry connecting the selected bit line (e.g., BL0) to a low voltage (e.g., to about 0V). Word line drivers corresponding to word lines for the selected memory cell can be driven to appropriate select voltages (e.g., VPR+Vbe), thereby placing the selected memory cell between suitable programming voltages after accounting for diode drop voltages.

An erase operation can occur in the same general fashion, but with the erase voltage plus a threshold voltage being applied to the selected bit line, and different values in some cases being driven on the corresponding word lines. As noted in the example of FIG. 1, in particular embodiments, such an operation can be symmetrical. In certain embodiments, associated word line drivers can provide appropriate voltages and/or currents to enable diodes 704 and 706 to be controlled such that a suitable bias voltage can be applied across resistive storage element 208. In this way, bit line or cathode selection, as well as word line activation, can be utilized to program and/or erase memory cells in a resistive memory (e.g., CBRAM) array having bit lines connected to cathodes of resistive storage elements. As will be discussed below, the word lines and bit lines of the array can be configured in order to execute a given command (e.g., program, erase, read) on a selected memory cell, while substantially avoiding or minimizing disturb of other (deselected) memory cells.

Figure 16:
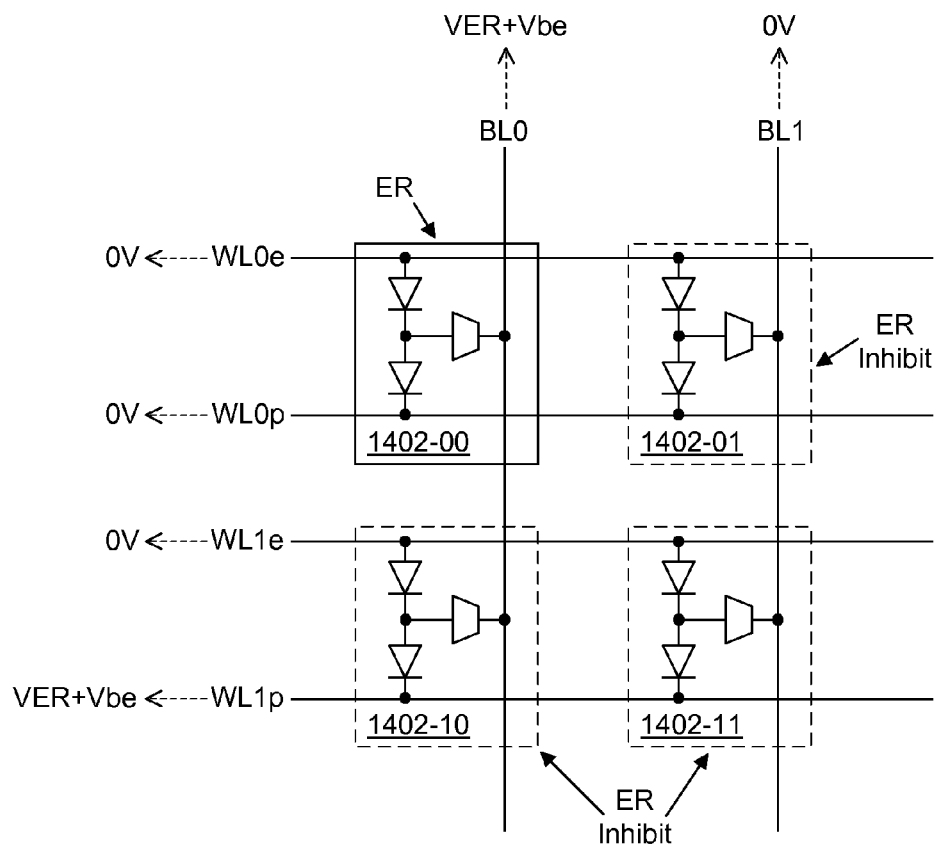
FIG. 16 is a schematic block diagram of an example diode select resistive memory cell erase operation in accordance with embodiments of the present invention.

Referring now to FIG. 16, shown is a schematic block diagram 1600 of an example diode select resistive memory cell erase operation in accordance with embodiments of the present invention. In this particular example, resistive memory cell 1402-00 can be selected and erased (ER), while memory cells 1402-01, 1402-10, and 1402-11 can be deselected and erase inhibited such that the resistive storage elements in those cells are not disturbed by erasing the selected cell. In this example, word lines WL0*e* and WL0*p* corresponding to the row of selected memory cell 1402-00 can be driven low (e.g., to about 0V). Also, bit line BL0 corresponding to the column of selected memory cell 702-00 can be driven to a high level (e.g., about VER+Vbe). For example, VER (e.g., about 1.4V or about 2.0V) can represent a voltage sufficient to erase resistive storage element 208 when applied across the anode and cathode thereof, and Vbe (e.g., about 600 mV) can represent a threshold voltage sufficient to turn on one of diodes 704 or 706. In this case, Vbe can be sufficient to turn on diode 706 to allow for VER to be applied across the anode and cathode of resistive storage element 208 in order to erase the selected memory cell.

For the deselected row, word lines WL1*e* can also be driven low (e.g., to about 0V), and WL1*p* can be driven to a high level (e.g., VER+Vbe). This can ensure that neither of diodes 704 and 706 may be turned on for memory cells 1402 (e.g., 1402-10 and 1402-11) along the deselected rows. Also, memory cell 1402-01 can be erase inhibited even though its word lines WL0*e* and WL0*p* are low because bit line BL1 is also low (e.g., about 0V). Thus, an erase voltage may not be developed across the anode and cathode of resistive storage element 208 in memory cell 1402-01. In this way, selected memory cell 1402-00 can be erased, while deselected memory cells 1402-01, 1402-10, and 1402-11 can remain in an unchanged or undisturbed state.

Figure 17:
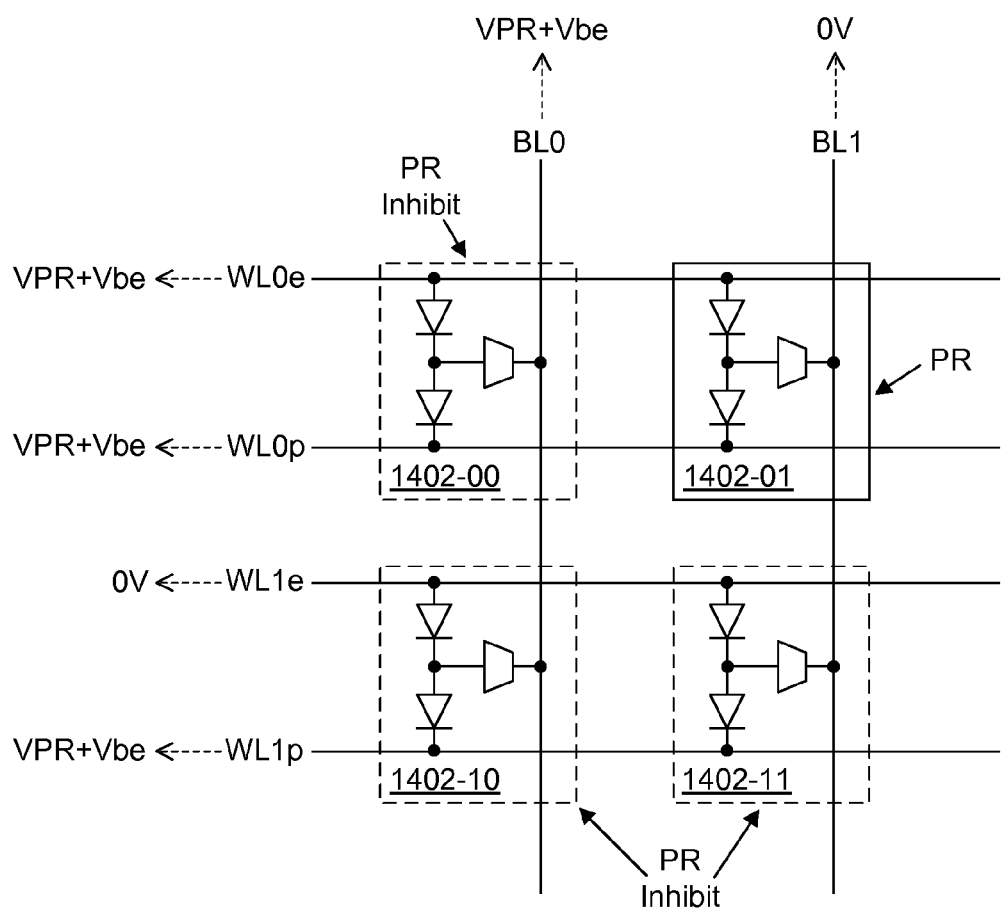
FIG. 17 is a schematic block diagram of an example diode select resistive memory cell program operation in accordance with embodiments of the present invention.

Referring now to FIG. 17, shown is a schematic block diagram 1700 of an example diode select resistive memory cell program operation in accordance with embodiments of the present invention. In this particular example, resistive memory cell 1402-01 can be selected and programmed (PR), while memory cells 1402-00, 1402-10, and 1402-11 can be deselected and program inhibited such that the resistive storage elements in those cells are not disturbed by programming the selected cell. In this example, word lines WL0*e* and WL0*p* corresponding to the row of selected memory cell 1402-01 can be driven high (e.g., to about VPR+Vbe). Also, bit line BL1 corresponding to the column of selected memory cell 1402-01 can be driven to a low level (e.g., about 0V). For example, VPR (e.g., about 2.0V) can represent a voltage sufficient to program resistive storage element 208 when applied across the cathode and anode thereof, and Vbe (e.g., about 600 mV) can represent a threshold voltage sufficient to turn on one of diodes 704 or 706. In this case, Vbe can be sufficient to turn on diode 704 to allow for VPR to be applied in forward bias across the anode and cathode of resistive storage element 208 in order to program the selected memory cell.

For the deselected row, word lines WL1*e* can also be driven low (e.g., to about 0V), and WL1*p* can be driven to a high level (e.g., about VPR+Vbe). This can ensure that neither of diodes 704 and 706 may be turned on for memory cells 1402 (e.g., 1402-10 and 1402-11) along the deselected rows. Also, memory cell 1402-00 can be program inhibited even though its word lines WL0*e* and WL0*p* are high because bit line BL0 may also be high (e.g., about VPR+Vbe). Thus, a program voltage may not be developed across the anode and cathode of resistive storage element 208 in memory cell 1402-00. In this way, selected memory cell 1402-01 can be programmed, while deselected memory cells 1402-00, 1402-10, and 1402-11 can remain in an unchanged (undisturbed) state.

Figure 18:
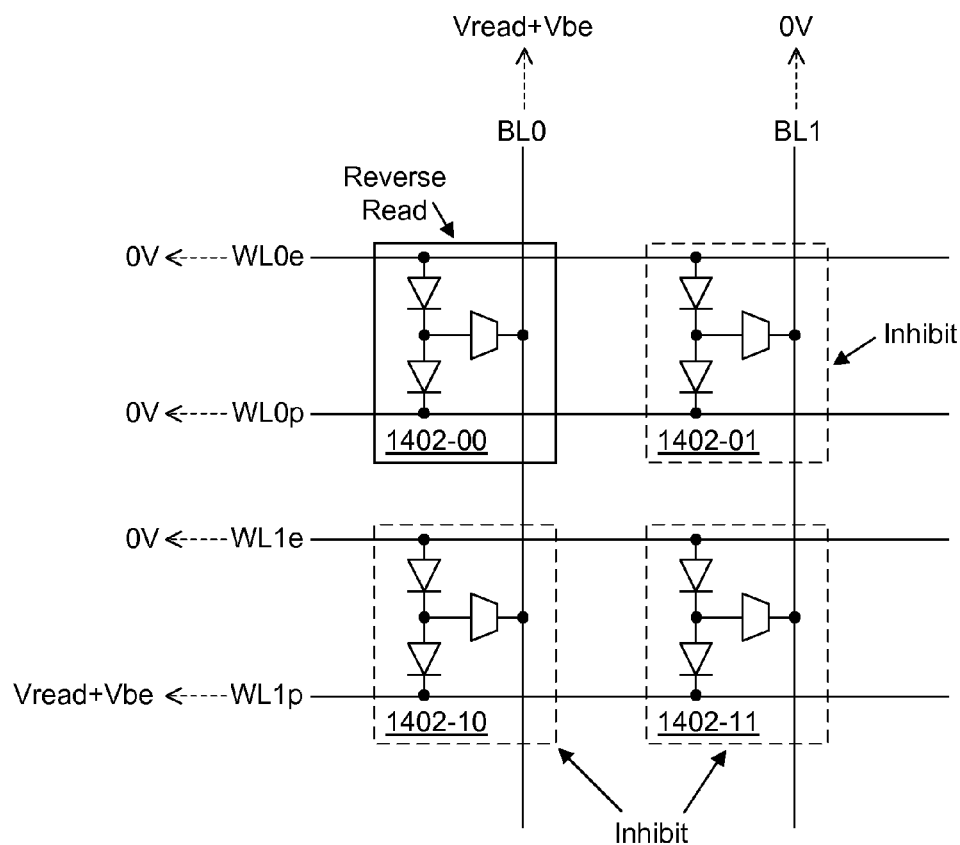
FIG. 18 is a schematic block diagram of an example diode select resistive memory cell reverse read operation in accordance with embodiments of the present invention.

Referring now to FIG. 18, shown is a schematic block diagram 1800 of an example diode select resistive memory cell reverse read operation in accordance with embodiments of the present invention. As discussed above, bidirectional sensing circuit 404 can be employed to read a state of a resistive memory cell in either a forward bias (forward read) or a reverse bias (reverse read) configuration. In this way, power savings due to signal line swings on word lines and bit lines for program and erase verify operations can be reduced in many applications. Thus, whether a reverse read (e.g., FIG. 18) or a forward read (see, e.g., FIG. 19) is employed to execute a read command or as part of a program or erase algorithm can be determined based on whether the read operation is being used for a program verify (forward read) or an erase verify (reverse read) operation.

In this particular example, resistive memory cell 1402-00 can be selected and read, while memory cells 1402-01, 1402-10, and 1402-11 can be deselected and inhibited such that the resistive storage elements in those cells are not disturbed by reading the selected cell. In this example, word lines WL0*e* and WL0*p* corresponding to the row of selected memory cell 1402-00 can be driven low (e.g., to about 0V). Also, bit line BL0 corresponding to the column of selected memory cell 1402-00 can be driven to a high level (e.g., about Vread+Vbe). For example, Vread (e.g., about 200 mV) can represent a voltage sufficient to read or sense a state of resistive storage element 208 when applied across the cathode and anode thereof, and Vbe (e.g., about 600 mV) can represent a threshold voltage sufficient to turn on one of diodes 704 or 706. In this case, Vbe can be sufficient to turn on diode 706 to allow for Vread to be applied across the cathode and anode of resistive storage element 208 in order to sense the selected memory cell.

For the deselected row, word lines WL1e can also be driven low (e.g., to about 0V), and WL1p can be driven to a high level (e.g., Vread+Vbe). This can ensure that neither of diodes 704 and 706 may be turned on for memory cells 1402 (e.g., 1402-10 and 1402-11) along the deselected row. Also, memory cell 1402-01 can be read inhibited even though its word lines WL0e and WL0p are low because bit line BL1 is also low (e.g., about 0V). Thus, a read voltage may not be developed across the anode and cathode of resistive storage element 208 in memory cell 1402-01. In this way, selected memory cell 1402-00 can be sensed in a reverse bias read, while deselected memory cells 1402-01, 1402-10, and 1402-11 can remain undisturbed.

Figure 19:
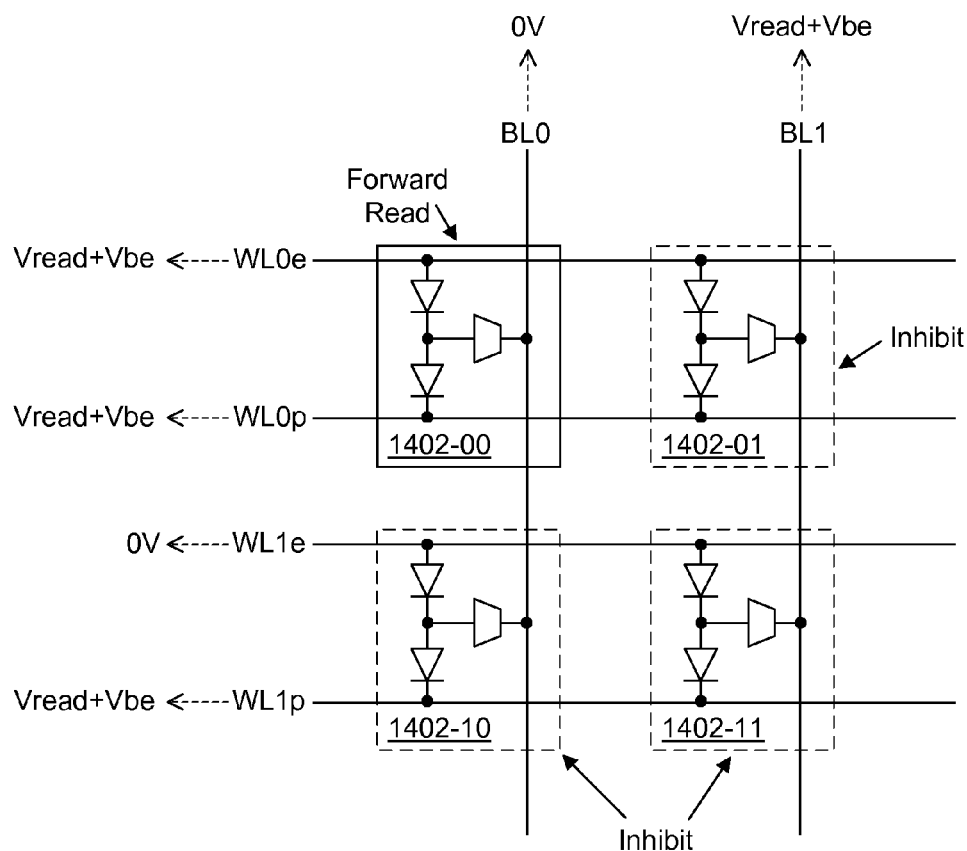
FIG. 19 is a schematic block diagram of an example diode select resistive memory cell forward read operation in accordance with embodiments of the present invention.

Referring now to FIG. 19, shown is a schematic block diagram 1900 of an example diode select resistive memory cell forward read operation in accordance with embodiments of the present invention. Also in this example, resistive memory cell 1402-00 can be selected and read, while memory cells 1402-01, 1402-10, and 1402-11 can be deselected and inhibited such that the resistive storage elements in those cells are not disturbed by reading the selected cell. In this example, word lines WL0e and WL0p corresponding to the row of selected memory cell 1402-00 can be driven high (e.g., to about Vread+Vbe), and bit line BL0 corresponding to the column of selected memory cell 1402-00 can be driven to a low level (e.g., about 0V). For the deselected row, word lines WL1e can also be driven low (e.g., to about 0V), and WL1p can be driven to a high level (e.g., about Vread+Vbe) to ensure that neither of diodes 704 and 706 may be turned on for memory cells 1402 (e.g., 1402-10 and 1402-11) along the deselected row. Also, memory cell 1402-01 can be read inhibited even though its word lines WL0e and WL0p are high because bit line BL1 is also high (e.g., about Vread+Vbe). Thus, a read voltage may not be developed across the anode and cathode of resistive storage element 208 in memory cell 1402-01. In this way, selected memory cell 1402-00 can be sensed in a forward bias read, while deselected memory cells 1402-01, 1402-10, and 1402-11 can remain undisturbed.

In one embodiment, a method of controlling a resistive switching memory device having a plurality of resistive memory cells, can include: (i) determining a command for execution on a selected resistive memory cell, wherein each resistive memory cell comprises: a first diode having an anode coupled to a first word line and a cathode coupled to a common node, a second diode having an anode coupled to the common node and a cathode coupled to a second word line, and a resistive storage element having a cathode coupled to a bit line and an anode coupled to the common node; (ii) in response to the command being an erase operation: setting the first and second word lines for the selected resistive memory cell, and the first word line and the bit line for deselected resistive memory cells, to about 0V, and setting the bit line for the selected resistive memory cell and the second word line for the deselected resistive memory cells to an erase voltage plus a threshold voltage; and (iii) in response to the command being a program operation: setting the first and second word lines for the selected resistive memory cell, and the second word line and the bit line for deselected resistive memory cells, to about a program voltage plus the threshold voltage, and setting the bit line for the selected resistive memory cell and the first word line for the deselected resistive memory cells to about 0V.

Figure 20:
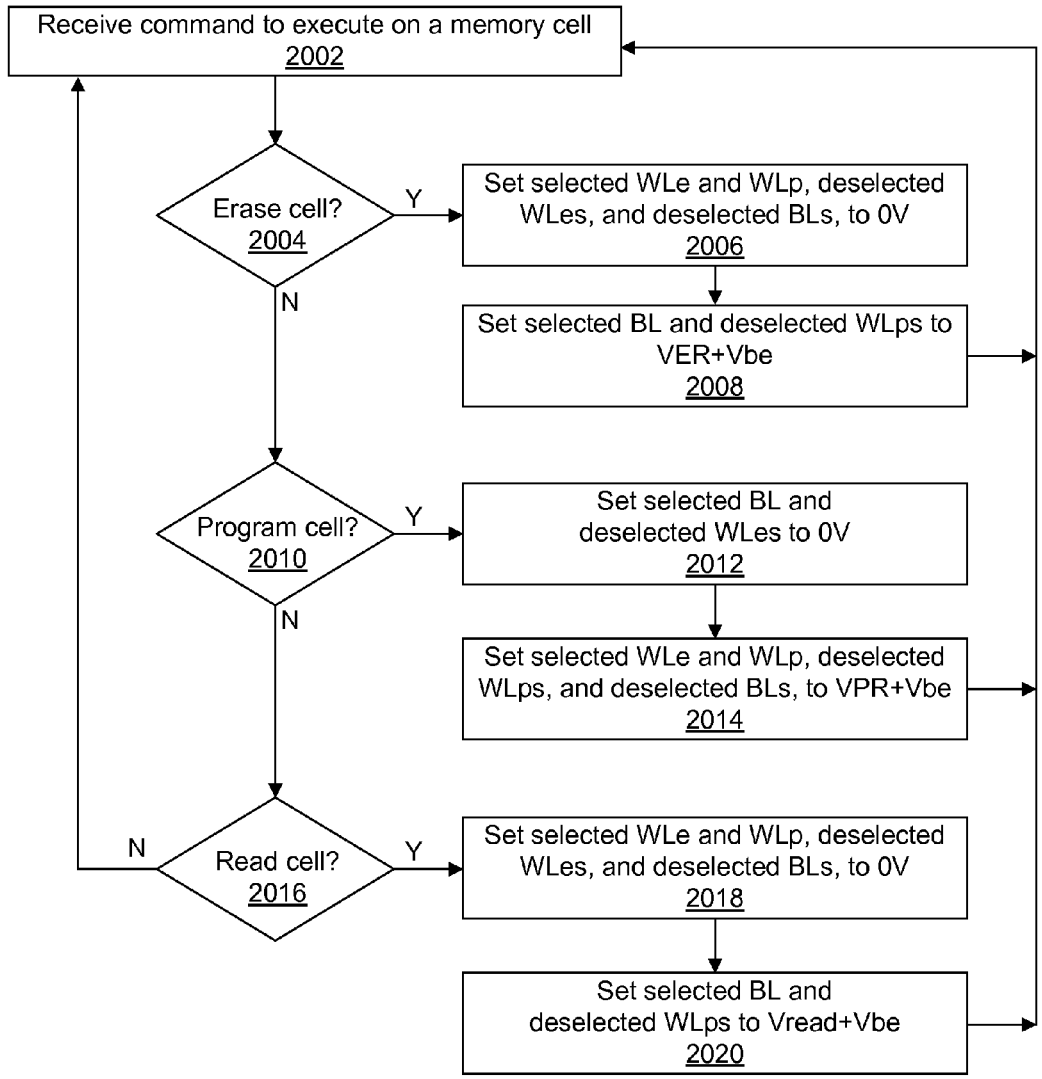
FIG. 20 is a flow diagram of an example method of controlling a diode select resistive memory device, in accordance with embodiments of the present invention.

Referring now to FIG. 20, shown is a flow diagram of an example method 2000 of operating a diode select resistive memory device, in accordance with embodiments of the present invention. At 2002, a command to be executed on a resistive memory cell can be received. For example, command decoder 120 can provide an indication of whether the command is a program, erase, or read (e.g., program verify or erase verify) command. At 2004, if a cell is to be erased, at 2006, selected word lines WLe and WLp, along with deselected WLes and deselected bit lines can be set to about 0V. At 2008, selected bit lines and deselected word lines WLps can be set to about VER+Vbe. In this way, a selected resistive memory cell at an intersection of selected word lines and bit lines can be erased, while deselected memory cells are not disturbed by such an erase operation.

At 2010, if a cell is to be programmed, at 2012, a selected bit line and deselected word lines WLes can be set to about 0V. At 2014, selected word lines WLe and WLp, deselected word lines WLps, and deselected bit lines can be set to about VPR+Vbe. In this way, a selected resistive memory cell at an intersection of selected word lines and bit lines can be programmed, while deselected memory cells are not disturbed by such a program operation.

At 2016, if a cell is to be read (e.g., for an erase verify), at 2018, selected word lines WLe and WLp, along with deselected WLes and deselected bit lines can be set to about 0V. At 2020, selected bit lines and deselected word lines WLps can be set to about Vread+Vbe. In this way, a selected resistive memory cell at an intersection of selected word lines and bit lines can be sensed, while deselected memory cells are not disturbed by such a read operation. While a reverse read operation is described in this particular example, the read operation can be configured as a reverse read (see, e.g., FIG. 18) or as a forward read (see, e.g., FIG. 19). For example, a program verify operation can include a forward read, while an erase verify operation can include a reverse read.

Thus in particular embodiments, diode selection can be employed in a resistive switching memory device. As discussed above, twin word lines for a given row, along with a bit line for each column, can be controlled in order to execute a command or algorithm portion on a given resistive memory cell. In addition, the word line and bit line settings for deselected memory cells can be configured such that these memory cells are not disturbed by the particular command or algorithm execution on a selected memory cell.

In addition, while the above examples have described a single cell in a given memory array as being selected, and all others as being deselected, particular embodiments may also support any number of memory cells being selected at a given time. For example, parallel read or write (e.g., program/erase) operations whereby a plurality of resistive memory cells are accessed or selected together for execution of a particular operation can also be accommodated in particular embodiments. In one example, a number of adjacent memory cells or memory cells selected at a given interval or distance apart, can be supported as selected memory cells for a parallel operation in particular embodiments. In other cases, an entire memory array or group of memory cells can be selected together such that the same operation (e.g., a block write) can be performed on each memory cell in the array. In addition, various test modes whereby multiple memory cells can be selected and accessed together can also be supported in particular embodiments. Thus, any combination or number of resistive memory cells can be selected (e.g., by suitable decoding) in particular embodiments.

Resistive switching memory cells as discussed herein may also each support more than one memory state. In addition, depending on the voltage level controls, instead of a full erase or a full program/write, partial operations (e.g., by applying less/predetermined voltages for forward bias and reverse bias of the CBRAM cell, by applying different program current, etc.) can be performed. Such partial operations can produce different resistance and linear/nonlinear values in the cell, as opposed to the cell having an on/off resistance corresponding to two storage states. Instead, a binary coding of, e.g., eight different bands or ranges of CBRAM cell on resistances can be converted into 3-bit storage values. Thus in this example, eight different data values can be stored in a given CBRAM cell. Of course, other numbers of data values can be stored based on the resistance, linearity, bias voltage, and/or current characteristics.

While the above examples include circuit, operational, and structural implementations of certain memory cells and programmable impedance devices, one skilled in the art will recognize that other technologies and/or cell structures can be used in accordance with embodiments. Further, one skilled in the art will recognize that other device circuit arrangements, architectures, elements, and the like, may also be used in accordance with embodiments. Further, the resistance levels, operating conditions, and the like, may be dependent on the retention, endurance, switching speed, and variation requirements of a programmable impedance element.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A resistive switching memory device comprising a plurality of resistive memory cells, wherein each of the resistive memory cells comprises:
    a) a first diode having an anode coupled to a first word line and a cathode coupled to a common node;
    b) a second diode having an anode coupled to the common node and a cathode coupled to a second word line; and
    c) a resistive storage element having an anode coupled to a bit line and a cathode coupled to the common node, wherein the resistive memory cell is configured to be programmed to a low resistance state by application of a program voltage in a forward bias direction, and to be erased to a high resistance state by application of an erase voltage in a reverse bias direction.

2. The resistive switching memory device of claim 1, wherein:
    a) the plurality of resistive memory cells are arranged in X rows and Y columns of a memory array;
    b) the first and second word lines are arranged in one of the X rows; and
    c) the bit line is arranged in one of the Y columns.

3. The resistive switching memory device of claim 1, wherein each of the first and second diodes comprises a thin film diode.

4. The resistive switching memory device of claim 1, wherein each of the plurality of resistive memory cells excludes a transistor.

5. The resistive switching memory device of claim 1, wherein a selected resistive memory cell is configured to be programmed by driving:
    a) the first word line to about 0V;
    b) the second word line to about 0V; and
    c) the bit line to about the program voltage plus a threshold voltage.

6. The resistive switching memory device of claim 5, wherein a deselected resistive memory cell that shares the first and second word lines is configured to be inhibited from programming by driving the bit line to about 0V.

7. The resistive switching memory device of claim 6, wherein a deselected resistive memory cell in a different row is configured to be inhibited from programming by driving:
    a) the first word line to about 0V; and
    b) the second word line to about the program voltage plus the threshold voltage.

8. The resistive switching memory device of claim 1, wherein a selected resistive memory cell is configured to be erased by driving:
    a) the first word line to about the erase voltage plus a threshold voltage;
    b) the second word line to about the erase voltage plus the threshold voltage; and
    c) the bit line to about 0V.

9. The resistive switching memory device of claim 8, wherein a deselected resistive memory cell that shares the first and second word lines is configured to be inhibited from erasing by driving the bit line to about the erase voltage plus the threshold voltage.

10. The resistive switching memory device of claim 9, wherein a deselected resistive memory cell in a different row is configured to be inhibited from erasing by driving:
    a) the first word line to about 0V; and
    b) the second word line to about the erase voltage plus the threshold voltage.

11. The resistive switching memory device of claim 1, wherein a selected resistive memory cell is configured to be read in a forward read by driving:
    a) the first word line to about 0V;
    b) the second word line to about 0V; and
    c) the bit line to about a read voltage plus a threshold voltage.

12. The resistive switching memory device of claim 11, wherein a deselected resistive memory cell that shares the first and second word lines is configured to be inhibited from reading by driving the bit line to about 0V.

13. The resistive switching memory device of claim 12, wherein a deselected resistive memory cell in a different row is configured to be inhibited from reading by driving:
    a) the first word line to about 0V; and
    b) the second word line to about the read voltage plus the threshold voltage.

14. The resistive switching memory device of claim 1, wherein a selected resistive memory cell is configured to be read in a reverse read by driving:
    a) the first word line to about a read voltage plus a threshold voltage;
    b) the second word line to about the read voltage plus the threshold voltage; and
    c) the bit line to about 0V.

15. The resistive switching memory device of claim 14, wherein a deselected resistive memory cell that shares the first and second word lines is configured to be inhibited from reading by driving the bit line to about the read voltage plus the threshold voltage.

16. The resistive switching memory device of claim 15, wherein a deselected resistive memory cell in a different row is configured to be inhibited from reading by driving:
    a) the first word line to about 0V; and b) the second word line to about the read voltage plus the threshold voltage.

17. A resistive switching memory device comprising a plurality of resistive memory cells, wherein each of the resistive memory cells comprises:
 a) a first diode having an anode coupled to a first word line and a cathode coupled to a common node;
 b) a second diode having an anode coupled to the common node and a cathode coupled to a second word line; and
 c) a resistive storage element having a cathode coupled to a bit line and an anode coupled to the common node, wherein the resistive memory cell is configured to be programmed to a low resistance state by application of a program voltage in a forward bias direction, and to be erased to a high resistance state by application of an erase voltage in a reverse bias direction.

18. A method of controlling a resistive switching memory device having a plurality of resistive memory cells, the method comprising:
 a) determining a command for execution on a selected resistive memory cell, wherein each resistive memory cell comprises: a first diode having an anode coupled to a first word line and a cathode coupled to a common node, a second diode having an anode coupled to the common node and a cathode coupled to a second word line, and a resistive storage element having an anode coupled to a bit line and a cathode coupled to the common node;
 b) in response to the command being a programming operation: setting the first and second word lines for the selected resistive memory cell, and the first word line and the bit line for deselected resistive memory cells, to about 0V, and setting the bit line for the selected resistive memory cell and the second word line for the deselected resistive memory cells to a program voltage plus a threshold voltage; and
 c) in response to the command being an erase operation: setting the first and second word lines for the selected resistive memory cell, and the second word line and the bit line for deselected resistive memory cells, to about an erase voltage plus the threshold voltage, and setting the bit line for the selected resistive memory cell and the first word line for the deselected resistive memory cells to about 0V.

19. The method of claim 18, further comprising in response to the command being a read operation, executing a forward read by:
 a) setting the first and second word lines for the selected resistive memory cell, and the second word line and the bit line for deselected resistive memory cells, to about 0V; and
 b) setting the bit line for the selected resistive memory cell and the second word line for the deselected resistive memory cells to about a read voltage plus the threshold voltage.

20. The method of claim 18, further comprising in response to the command being a read operation, executing a reverse read by:
 a) setting the first and second word lines for the selected resistive memory cell, and the second word line and the bit line for deselected resistive memory cells, to about a read voltage plus the threshold voltage; and
 b) setting the bit line for the selected resistive memory cell and the first word line for the deselected resistive memory cells to about 0V.

* * * * *